(12) United States Patent
Mallela et al.

(10) Patent No.: US 10,957,603 B2
(45) Date of Patent: Mar. 23, 2021

(54) VERTICAL FET DEVICES WITH MULTIPLE CHANNEL LENGTHS

(71) Applicant: International Business Machines Corporation, Armonk, NY (US)

(72) Inventors: Hari V. Mallela, Poughquag, NY (US); Reinaldo A. Vega, Mahopac, NY (US); Rajasekhar Venigalla, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/438,573

(22) Filed: Jun. 12, 2019

(65) Prior Publication Data

US 2019/0295897 A1    Sep. 26, 2019

Related U.S. Application Data

(62) Division of application No. 15/197,859, filed on Jun. 30, 2016, now Pat. No. 10,424,515.

(51) Int. Cl.
*H01L 27/088* (2006.01)
*H01L 21/8234* (2006.01)
(Continued)

(52) U.S. Cl.
CPC ........ *H01L 21/823456* (2013.01); *H01L 21/823412* (2013.01); *H01L 21/823468* (2013.01);
(Continued)

(58) Field of Classification Search
CPC ..... H01L 21/823412; H01L 21/823487; H01L 29/66666; H01L 27/088; H01L 21/823468;
(Continued)

(56) References Cited

U.S. PATENT DOCUMENTS 6,872,647 B1    3/2005   Yu et al.
7,687,339 B1    3/2010   Schultz et al.
(Continued)

FOREIGN PATENT DOCUMENTS

CN    101183664 A    5/2008
CN    102544049 A    7/2012
(Continued)

OTHER PUBLICATIONS

Examination Report for GB Application No. GB1900360.7, dated Apr. 18, 2019, 2 pages.
(Continued)

*Primary Examiner* — Hrayr A Sayadian
(74) *Attorney, Agent, or Firm* — Cantor Colburn LLP; Randall Bluestone

(57) ABSTRACT

A semiconductor device comprises a first source/drain region arranged on a semiconductor substrate, a second source/drain region arranged on the semiconductor substrate, a bottom spacer arranged on the first source/drain region, and a bottom spacer arranged on the second source/drain region. A first gate stack having a first length is arranged on the first source/drain region. A second gate stack having a second length is arranged on the second source/drain region, the first length is shorter than the second length. A top spacer is arranged on the first gate stack, and a top spacer is arranged on the second gate stack.

20 Claims, 21 Drawing Sheets

(51) Int. Cl.
  *H01L 29/66* (2006.01)
  *H01L 29/78* (2006.01)
  *H01L 21/8238* (2006.01)
(52) U.S. Cl.
  CPC .... *H01L 21/823487* (2013.01); *H01L 27/088* (2013.01); *H01L 29/66666* (2013.01); *H01L 29/7827* (2013.01); *H01L 21/82385* (2013.01); *H01L 21/823807* (2013.01); *H01L 21/823814* (2013.01); *H01L 21/823885* (2013.01)
(58) Field of Classification Search
  CPC ......... H01L 29/7827; H01L 21/823456; H01L 21/82385; H01L 21/823885; H01L 21/823807; H01L 21/823814
  USPC .......................................... 257/329; 438/156
  See application file for complete search history.

(56) References Cited

U.S. PATENT DOCUMENTS

| | | | |
|---|---|---|---|
| 8,653,584 B2 | 2/2014 | Renn | |
| 9,087,897 B1 | 7/2015 | Anderson et al. | |
| 9,190,466 B2 | 11/2015 | Basker et al. | |
| 9,299,835 B1 | 3/2016 | Anderson et al. | |
| 9,431,305 B1* | 8/2016 | Anderson | ....... H01L 21/823885 |
| 10,026,653 B2* | 7/2018 | Anderson | ......... H01L 21/32136 |
| 2008/0157225 A1 | 7/2008 | Datta et al. | |
| 2009/0057780 A1 | 3/2009 | Wong et al. | |
| 2015/0236094 A1 | 8/2015 | Hsiao et al. | |
| 2018/0005896 A1 | 1/2018 | Mallela et al. | |

FOREIGN PATENT DOCUMENTS

| | | |
|---|---|---|
| CN | 104752507 A | 7/2015 |
| CN | 105280698 A | 1/2016 |

OTHER PUBLICATIONS

International Preliminary Report on Patentability for PCT/IB2017/053238 dated Jan. 1, 2019, 6 pages.
International Search Report and the Written Opinion for International Application No. PCT/IB2017/053238 dated Sep. 1, 2017.
List of IBM Patents or Patent Applications Treated as Related; (Appendix P); Date Filed: Jun. 12, 2019, 2 pages.

* cited by examiner

VERTICAL FET DEVICES WITH MULTIPLE CHANNEL LENGTHS

DOMESTIC PRIORITY

This application is a divisional of U.S. patent application Ser. No. 15/197,859, filed Jun. 30, 2016, the disclosure of which is incorporated by reference herein in its entirety.

BACKGROUND

The present invention generally relates to vertical field effect transistors (VFETs), and more specifically, VFETS with dissimilar channel lengths.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions.

The FinFET is a type of MOSFET. The FinFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length cancan be achieved in a given region of the substrate as opposed to a planar FET device.

As CMOS scales to smaller dimensions, vertical FET devices provide advantages. A vertical FET often comprises an active source/drain region layer arranged on a substrate. A bottom spacer layer is arranged on the active source/drain region layer. The channel region of the FET device is arranged on the bottom spacer layer. The channel region cancan include any number of shapes including a fin shape.

The gate stack is arranged on the bottom spacer layer and around the channel region. A top spacer layer is arranged on the gate stack. The spacers are used to define the channel region in active areas of a semiconductor substrate located adjacent to the gate.

Device scaling drives the semiconductor industry, which reduces costs, decreases power consumption, and provides faster devices with increased functions per unit area. Improvements in optical lithography have played a major role in device scaling. However, optical lithography has limitations for minimum dimensions and pitch, which are determined by the wavelength of the irradiation.

SUMMARY

According to an embodiment of the present invention, a method for forming a semiconductor device comprises forming a first source/drain region and a second source/drain region on a semiconductor substrate, forming a first channel region and a second channel region on the substrate, and forming bottom spacer on the first source/drain region and the second source/drain region. A first gate stack is formed over the sidewalls of the first channel region and a second gate stack over the sidewalls of the second channel region. A gate conductor layer is formed over exposed portions of the bottom spacer and around the first gate stack and the second gate stack. A portion of the gate conductor layer adjacent to the first gate stack is removed and a portion of the gate conductor layer adjacent to the second gate stack is removed such that the gate conductor has a first thickness adjacent to the first gate stack and a second thickness adjacent to the second gate stack, the first thickness is less than the second thickness. Portions of the first gate stack and the second gate stack are removed to expose portions of the first channel region and the second channel region. A sacrificial spacer is formed over exposed portions of the first channel region and the second channel region. Exposed portions of the gate conductor layer are removed to expose portions of the bottom spacer. A top spacer is deposited over the first gate stack and the second gate stack. Exposed portions of the first channel region are removed to form a cavity in the top spacer. A third source/drain region is formed in the cavity in the top spacer and the inter-level dielectric layer.

According to another embodiment of the present invention, a method for forming a semiconductor device comprises forming a first cavity and a second cavity in a semiconductor substrate, forming a first source/drain region in the first cavity and a second source/drain region in the second cavity, forming a bottom spacer on the first source/drain region and the second source/drain region, and forming a first cavity in the bottom spacer that exposes a portion of the first source/drain region and forming a second cavity in the bottom spacer that exposes a portion of the second source/drain region. A first channel region is grown in the first cavity and a second channel region is grown in the second cavity. A portion of the bottom spacer is removed to expose sidewalls of the first channel region and the second channel region. A first gate stack is formed over the sidewalls of the first channel region and a second gate stack over the sidewalls of the second channel region. A gate conductor layer is formed over exposed portions of the bottom spacer and around the first gate stack and the second gate stack. A portion of the gate conductor layer is removed adjacent to the first gate stack. A portion of the gate conductor layer is removed adjacent to the second gate stack such that the gate conductor has a first thickness adjacent to the first gate stack and a second thickness adjacent to the second gate stack, the first thickness is less than the second thickness. Portions of the first gate stack and the second gate stack are removed to expose portions of the first channel region and the second channel region. A sacrificial spacer is removed over exposed portions of the first channel region and the second channel region. Exposed portions of the gate conductor layer are removed to expose portions of the bottom spacer. A top spacer is deposited over the first gate stack and the second gate stack. Exposed portions of the first channel region are removed to form a cavity in the top spacer, and a third source/drain region is formed in the cavity in the top spacer and the inter-level dielectric layer.

According to another embodiment of the present invention, a method for forming a semiconductor device comprises forming a first source/drain region and a second source/drain region on a substrate, forming a first spacer layer on the first source/drain region and the second source/drain region, forming a first cavity in the first spacer layer that exposes a portion of the first source/drain region and forming a second cavity in the first spacer layer that exposes the second source/drain region, and growing a first channel region in the first cavity and a second channel region in the second cavity. A gate stack layer is formed on the first channel region and the second channel region. A gate conductor layer is formed adjacent to the first gate stack and the second gate stack. A portion of the gate conductor layer is recessed adjacent to the first channel region. A second spacer is formed on the gate conductor layer, and a third source/drain region is formed on the first channel region and a fourth source/drain region on the second channel region.

According to another embodiment of the present invention, a method for forming a semiconductor device comprises forming a trench isolation region in a semiconductor substrate, forming a cavity in the substrate, forming a first source/drain region in the cavity, and forming a layer of spacer material on the first source/drain region. A cavity is formed in the layer of spacer material that exposes the first source/drain region. A channel region is grown in the cavity. Portions of the layer of spacer material are removed to expose portions of the channel region. A gate stack is formed on the channel region. A gate conductor layer is deposited on the gate stack. Portions of the gate conductor layer are removed to expose portions of the gate stack. Exposed portions of the gate stack are removed to expose portions of the channel region. A second layer of spacer material is deposited over the channel region. Portions of the channel region are remove to form a cavity in the second layer of spacer material, and second source/drain region is formed in the cavity in the second layer of spacer material.

According to yet another embodiment of the present invention, a semiconductor device comprises a first source/drain region arranged on a semiconductor substrate, a second source/drain region arranged on the semiconductor substrate, a bottom spacer arranged on the first source/drain region, and a bottom spacer arranged on the second source/drain region. A first gate stack having a first length is arranged on the first source/drain region. A second gate stack having a second length is arranged on the second source/drain region, the first length is shorter than the second length. A top spacer is arranged on the first gate stack, and a top spacer is arranged on the second gate stack.

DETAILED DESCRIPTION

Vertical field effect transistor (VFET) devices provide opportunities to increase device density on a wafer. Vertical FET devices have a source/drain region arranged on a substrate. The channel region is arranged vertically above the substrate such that the gate stack can wrap around the channel region. The embodiments described herein provide for forming vertical FET devices on a substrate that have dissimilar channel lengths. In one or more embodiments, multiple channel lengths are formed in the chip through a repeating sequence of patterning, gate metal and work function metal recess operations. Lithographic patterning operations are used to define regions of same channel length. Gate metal and work function metal recess operations are then used to set the desired channel length. All regions on the wafer requiring the same channel length are exposed to the recess steps at the same time. Other regions are covered by a hard mask defined in the patterning step.

Figure 1:
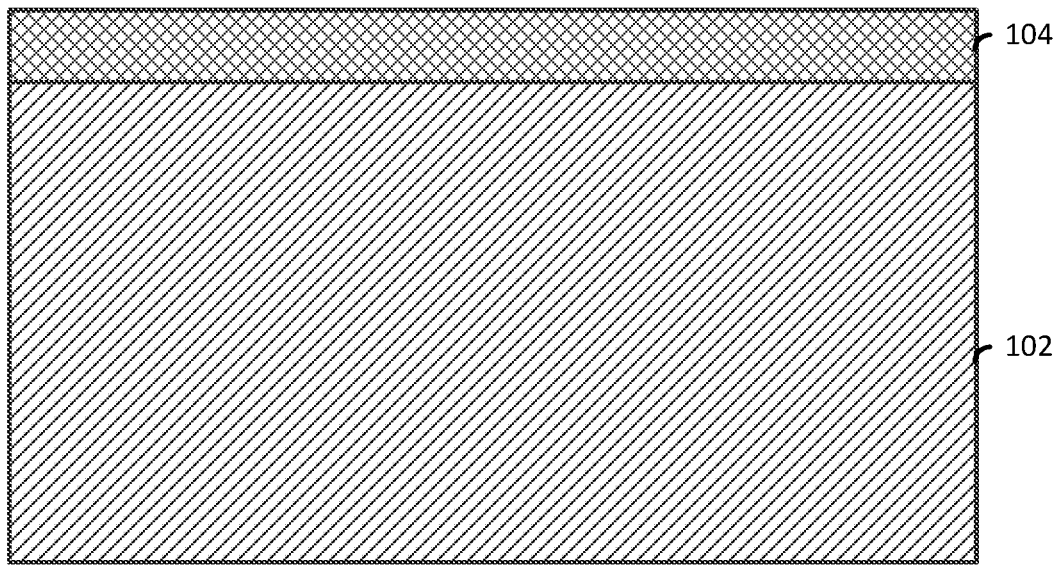
FIG. 1 illustrates a cut-away view of a bulk semiconductor substrate.

FIG. 1 illustrates a cut-away view of a bulk semiconductor substrate 102. The substrate 102 can include, for example, silicon, germanium, silicon germanium, silicon carbide, and those consisting essentially of III-V compound semiconductors having a composition defined by the formula $Al_{X1}Ga_{X2}Ga_{X2}In_{X3}As_{Y1}P_{Y2}N_{Y3}SB_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate 102 can also comprise an organic semiconductor or a layered semiconductor such as, for example, Si/SiGe, a silicon-on-insulator or a SiGe-on-insulator. A portion or entire semiconductor substrate 102 can be amorphous, polycrystalline, or monocrystalline. In addition to the aforementioned types of semiconductor substrates, the semiconductor substrate employed in the present invention can also comprise a hybrid oriented (HOT) semiconductor substrate in which the HOT substrate has surface regions of different crystallographic orientation. The semiconductor substrate 102 can be doped, undoped or contain doped regions and undoped regions therein. The semiconductor substrate can contain regions with strain and regions without strain therein, or contain regions of tensile strain and compressive strain.

A hardmask layer 104 is arranged on the semiconductor substrate 102. The hardmask 104 can include, for example, silicon oxide, silicon nitride (SiN), SiOCN, SiBCN or any suitable combination of those. The hardmask 104 can be deposited using a deposition process, including, but not limited to, PVD, CVD, PECVD, or any combination thereof.

Figure 2A:
FIG. 2A illustrates a cut-away view following a lithographic patterning and etching process that removes portions of the hardmask to expose portions of the substrate.
Figure 2A:
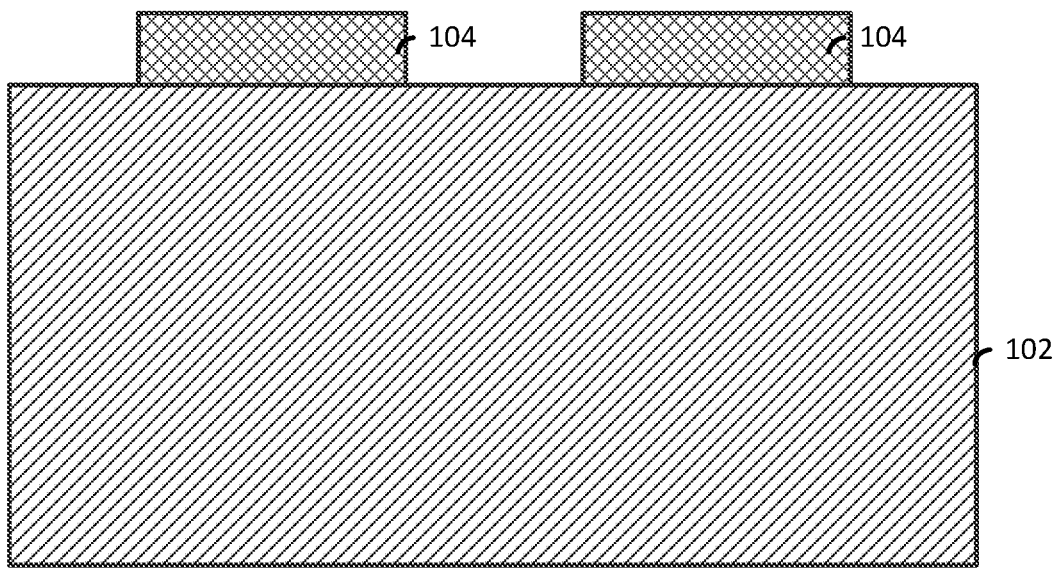
Figure 2B:
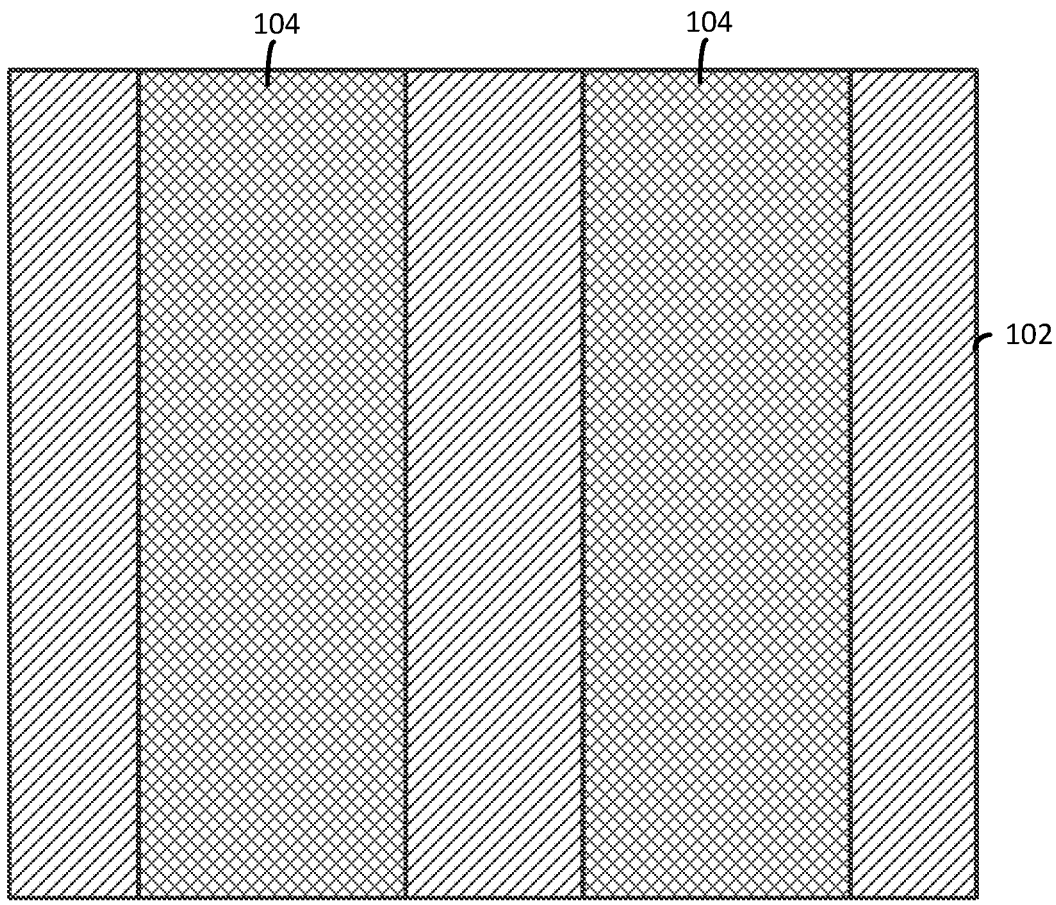
FIG. 2B illustrates a top view of the resultant structure following the patterning of the hardmask.

FIG. 2A illustrates a cut-away view following a lithographic patterning and etching process that removes portions of the hardmask 104 to expose portions of the substrate 102. The etching process can include, for example, reactive ion etching. FIG. 2B illustrates a top view of the resultant structure following the patterning of the hardmask 104.

Figure 3:
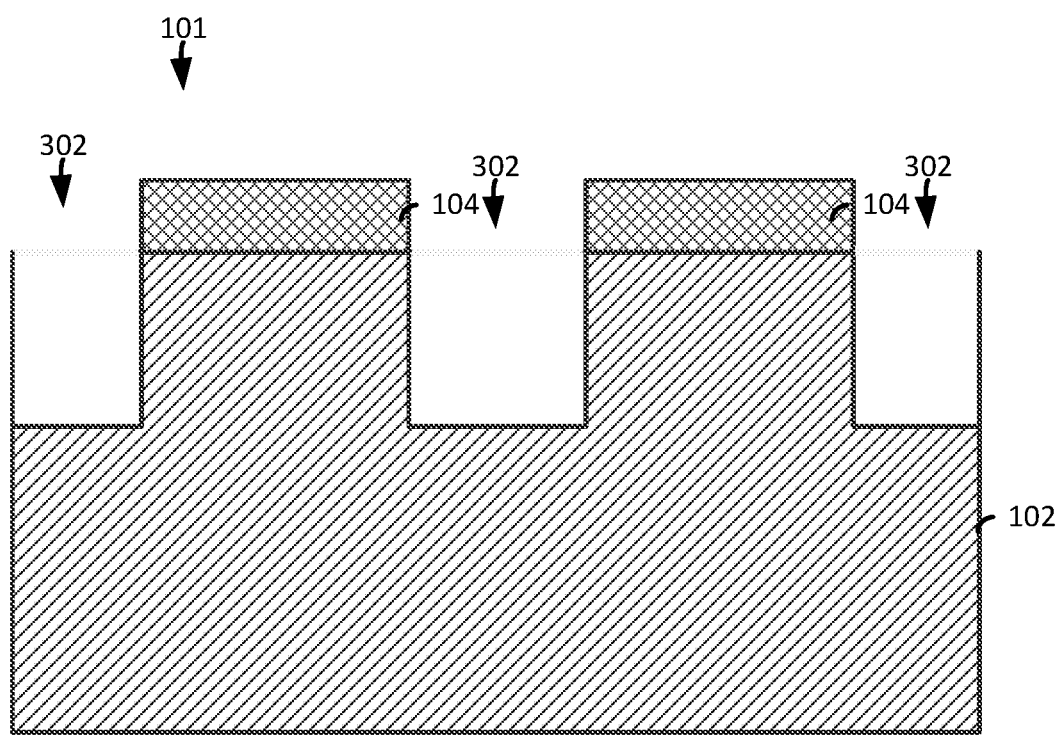
FIG. 3 illustrates a cut-away view following the formation of trenches.

FIG. 3 illustrates a cut-away view following the formation of trenches 302. The trenches 302 are formed by, for example a reactive ion etching process that removes exposed portions of the substrate 102 to form the trenches 302.

Figure 4:
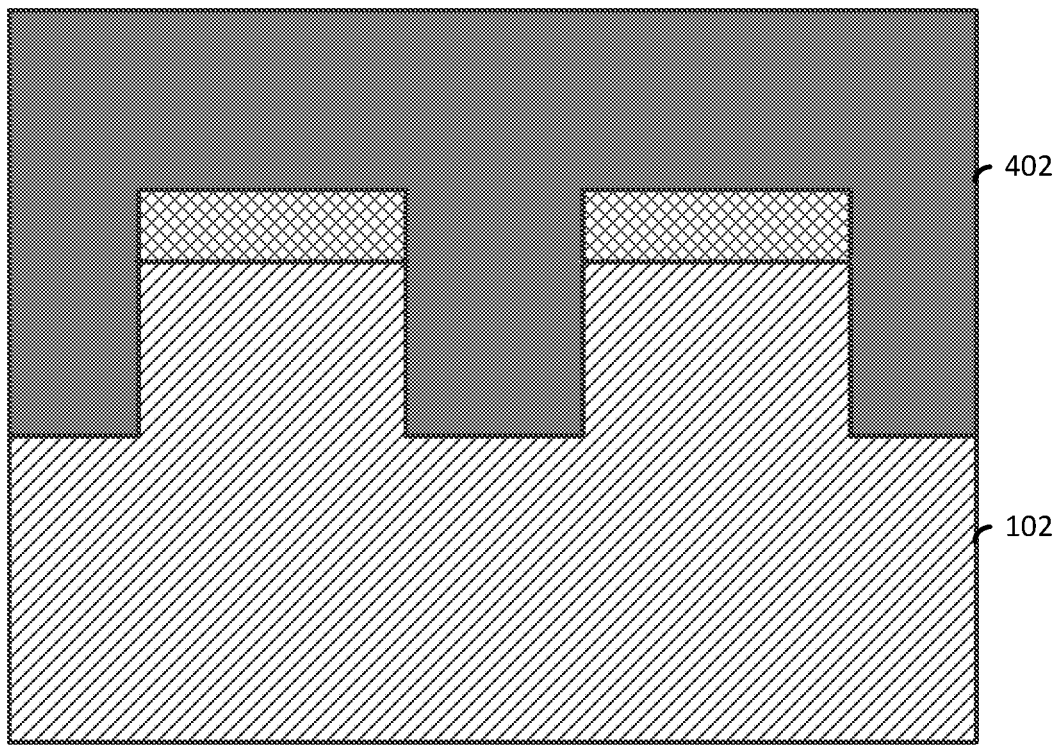
FIG. 4 illustrates a cut-away view following the deposition of an insulator material.

FIG. 4 illustrates a cut-away view following the deposition of an insulator material 402. The insulator material 402 can include, for example, silicon dioxide.

Figure 5:
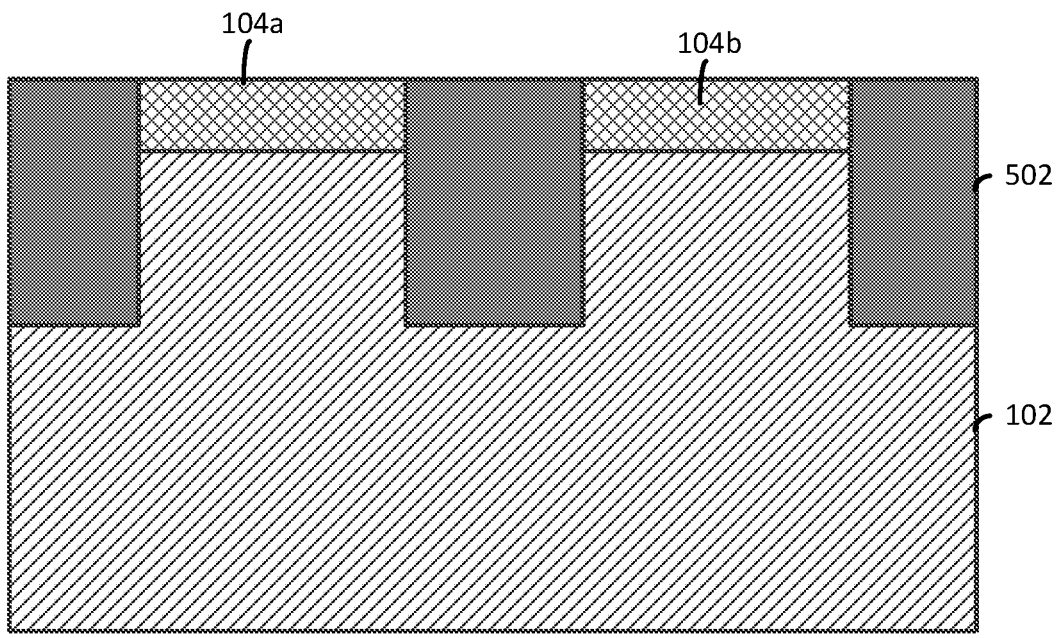
FIG. 5 illustrates a cut-away view following the removal of portions of the insulator layer to expose the hardmask to form a shallow trench isolation (STI) (isolation) region.

FIG. 5 illustrates a cut-away view following the removal of portions of the insulator layer 402 to expose the hardmask 104a and 104b to form a shallow trench isolation (STI) (isolation) region 502.

In the illustrated embodiment, at least one isolation region is a shallow trench isolation region ("STI"). However, the isolation region 502 can be a trench isolation region, a field oxide isolation region (not shown), or any other type of isolation region. The isolation region 502 provides isolation between neighboring gate structure regions, and can be used when the neighboring gates have opposite conductivities, e.g., nFETs and pFETs. As such, the isolation region 502 separates an nFET device region from a pFET device region.

Figure 6:
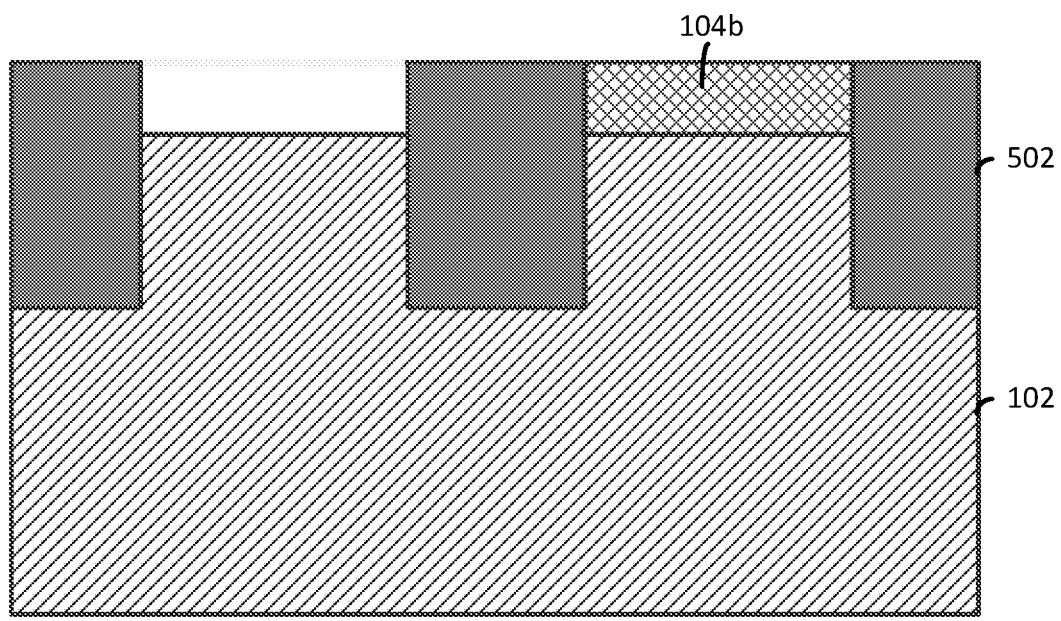
FIG. 6 illustrates a cut-away view following the removal of the hardmask.

FIG. 6 illustrates a cut-away view following the removal of the hardmask 104a. The hardmask 104a can be removed by, for example, patterning a mask (not shown) over the hardmask 104b, and performing a selective etching process that removes the exposed hardmask 104a.

Figure 7:
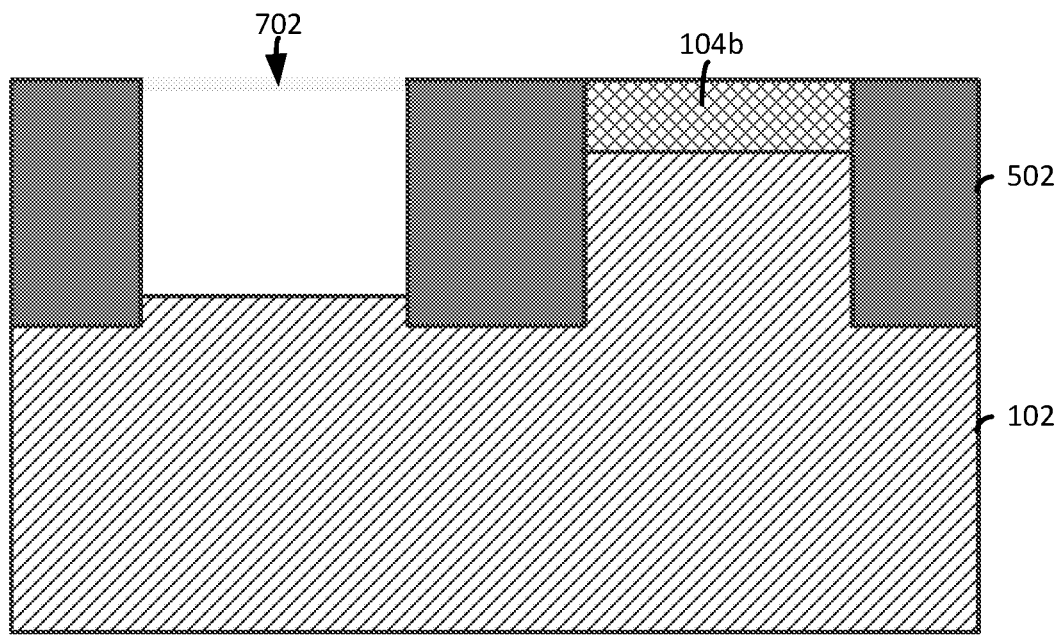
FIG. 7 illustrates a cut-away view of the resultant structure following a selective etching process that removes exposed portions of the substrate and forms a cavity.

FIG. 7 illustrates a cut-away view of the resultant structure following a selective etching process that removes exposed portions of the substrate 102 and forms a cavity 702.

Figure 8:
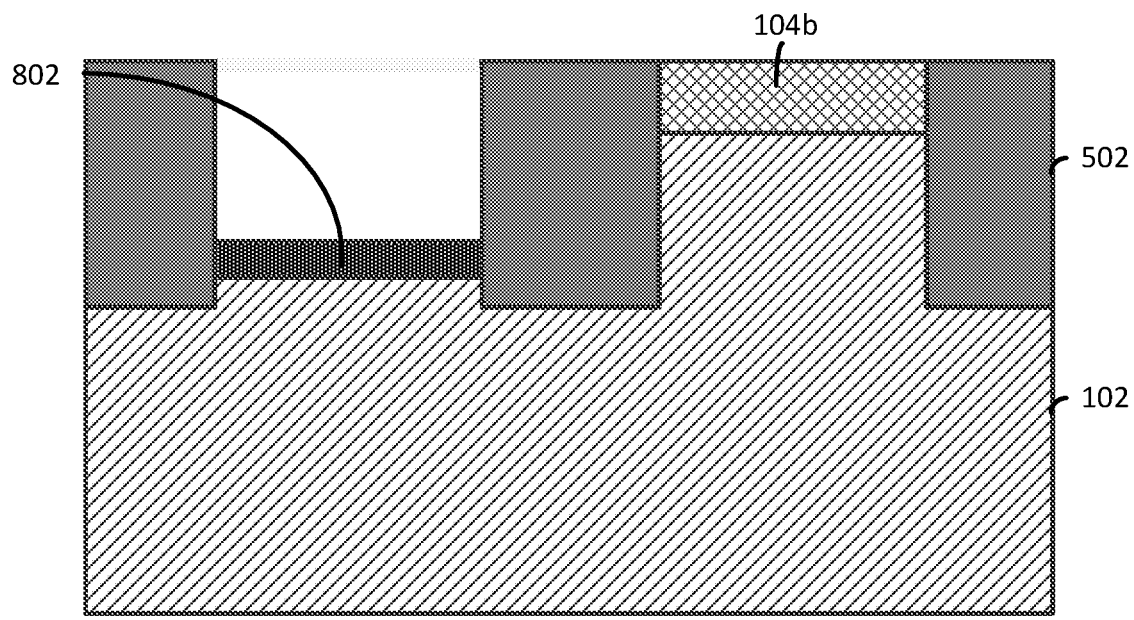
FIG. 8 illustrates a cut-away view following the formation of a source/drain region in the cavity.

FIG. 8 illustrates a cut-away view following the formation of a source/drain region 802 in the cavity 702. The source/drain regions 802 are formed by an epitaxial growth process that deposits a crystalline overlayer of semiconductor material onto the exposed crystalline seed material of the exposed substrate 102 to form the source/drain regions 802.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1 \times 10^{19}$ cm$^{-3}$ to $2 \times 10^{21}$ cm$^{-3}$, or preferably between $2 \times 10^{20}$ cm$^{-3}$ to $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 9:
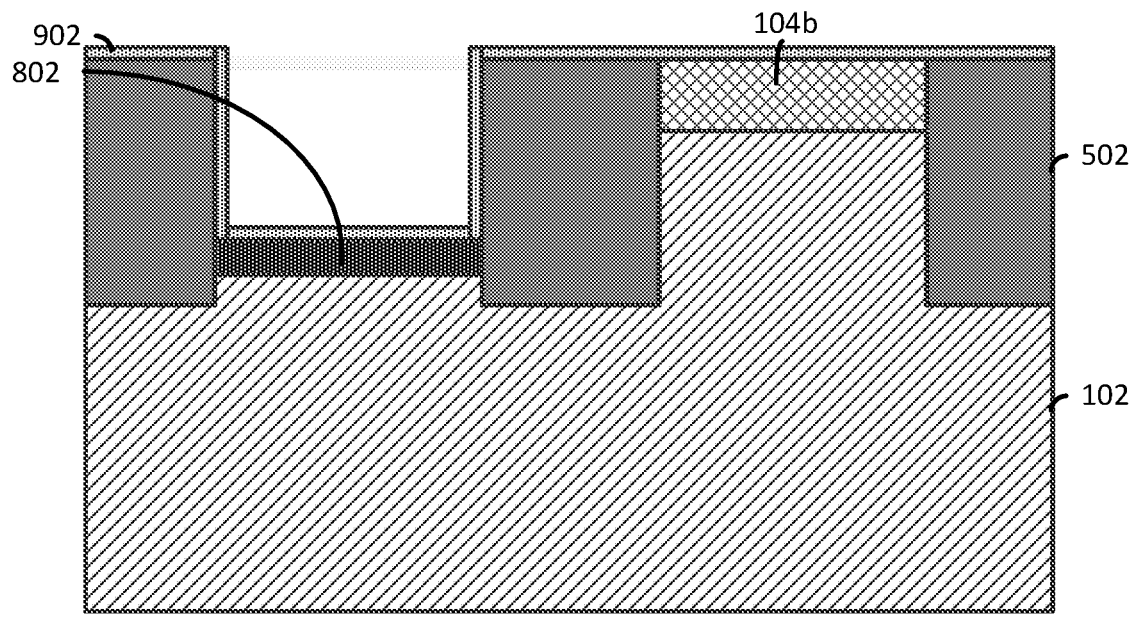
FIG. 9 illustrates a cut-away view following the deposition of a hardmask over the source/drain region the STI regions.

FIG. 9 illustrates a cut-away view following the deposition of a hardmask 902 over the source/drain region 802 the STI regions 502. The hardmask 902 of the illustrated exemplary embodiment includes an oxide material. Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Figure 10:
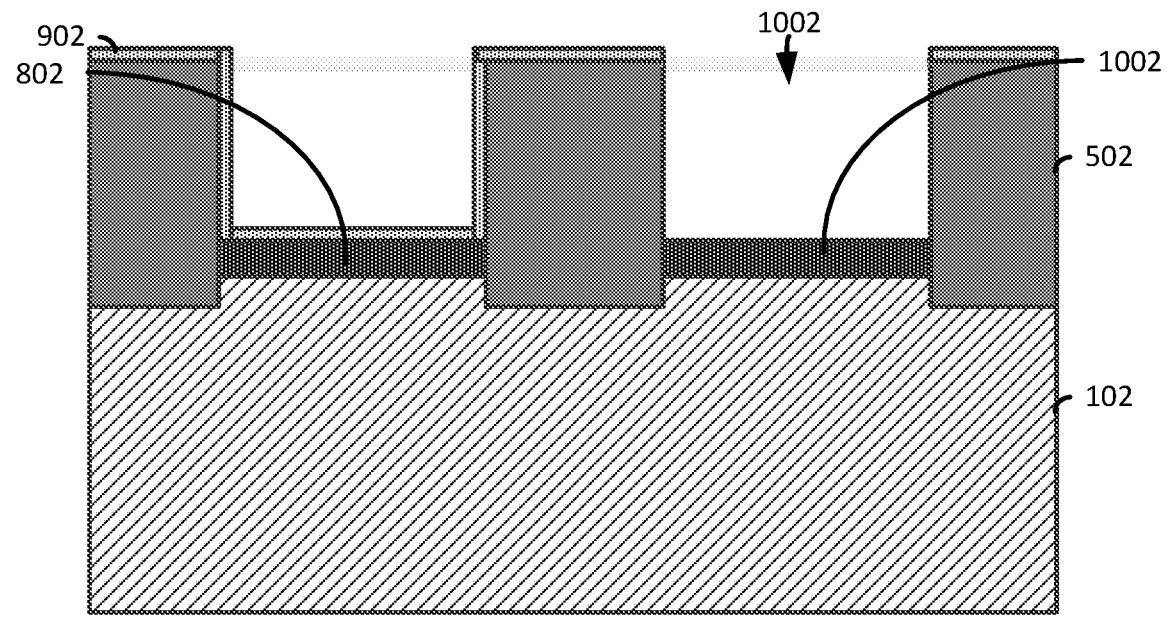
FIG. 10 illustrates a cut-away view following a lithographic patterning and etching process that removes exposed portions of the hardmask (of FIG. 9) and exposed portions of the substrate.

FIG. 10 illustrates a cut-away view following a lithographic patterning and etching process that removes exposed portions of the hardmask 902, the hardmask 104b (of FIG. 9) and exposed portions of the substrate 102. Following the etching process a source/drain region 1002 is formed in the cavity using a similar process as discussed above regarding the source/drain region 802.

Figure 11:
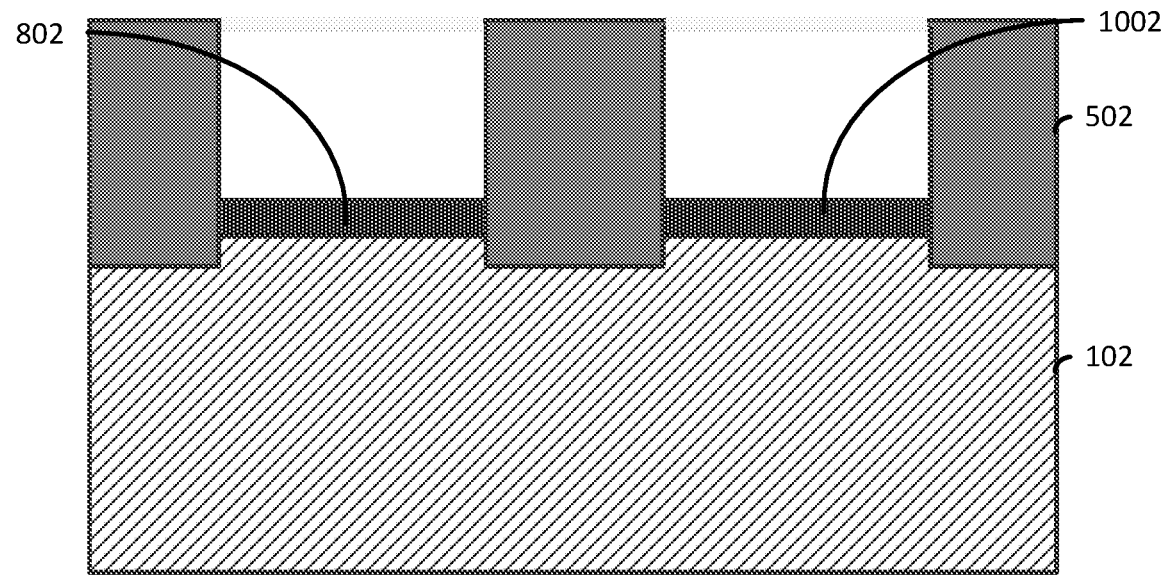
FIG. 11 illustrates a cut-away view following the removal of the hardmask (of FIG. 10).

FIG. 11 illustrates a cut-away view following the removal of the hardmask 902 (of FIG. 10.)

Figure 12:
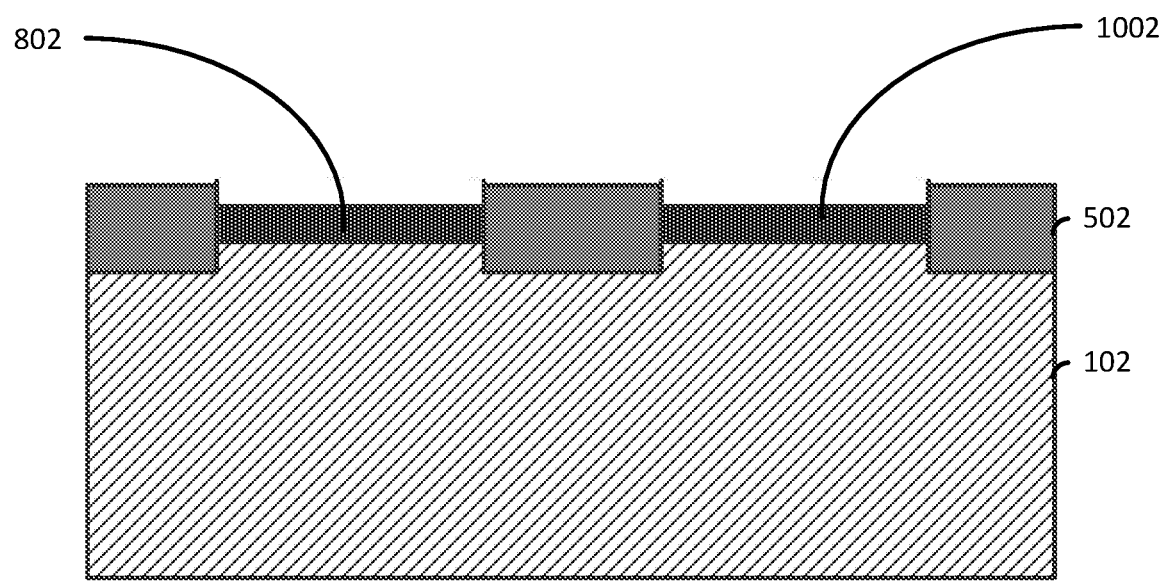
FIG. 12 illustrates a cut-away view following an etching process that removes portions of the STI region to reduce the height of the STI region.

FIG. 12 illustrates a cut-away view following an etching process that removes portions of the STI region 502 to reduce the height of the STI region 502.

Figure 13:
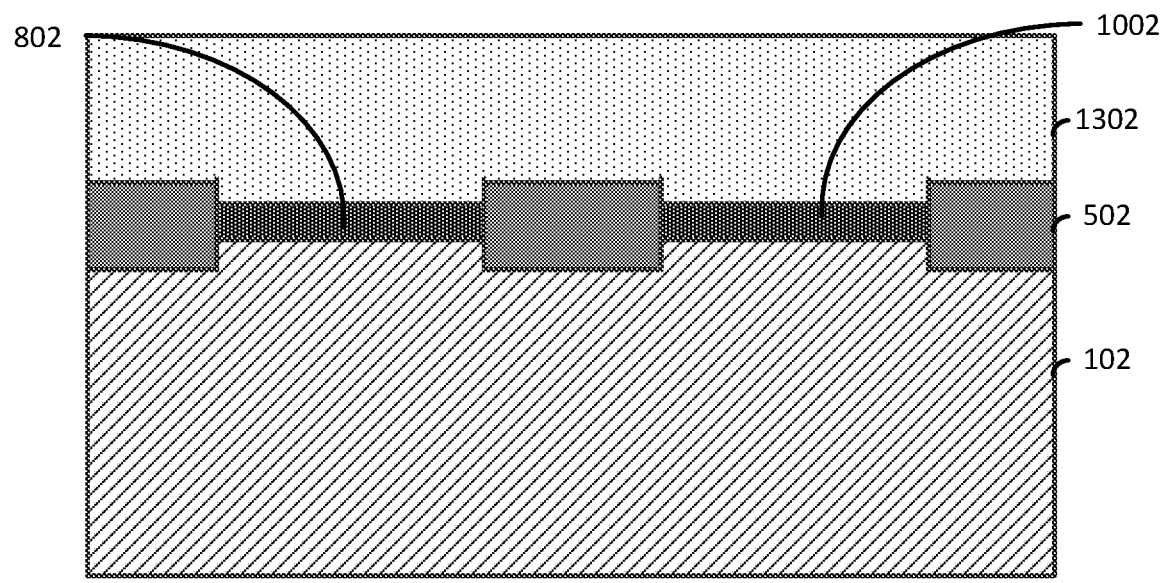
FIG. 13 illustrates a cut-away view following the deposition of a layer of spacer material over the source/drain regions.

FIG. 13 illustrates a cut-away view following the deposition of a layer of spacer material 1302 over the source/drain regions 802 and 1002. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Figure 14:
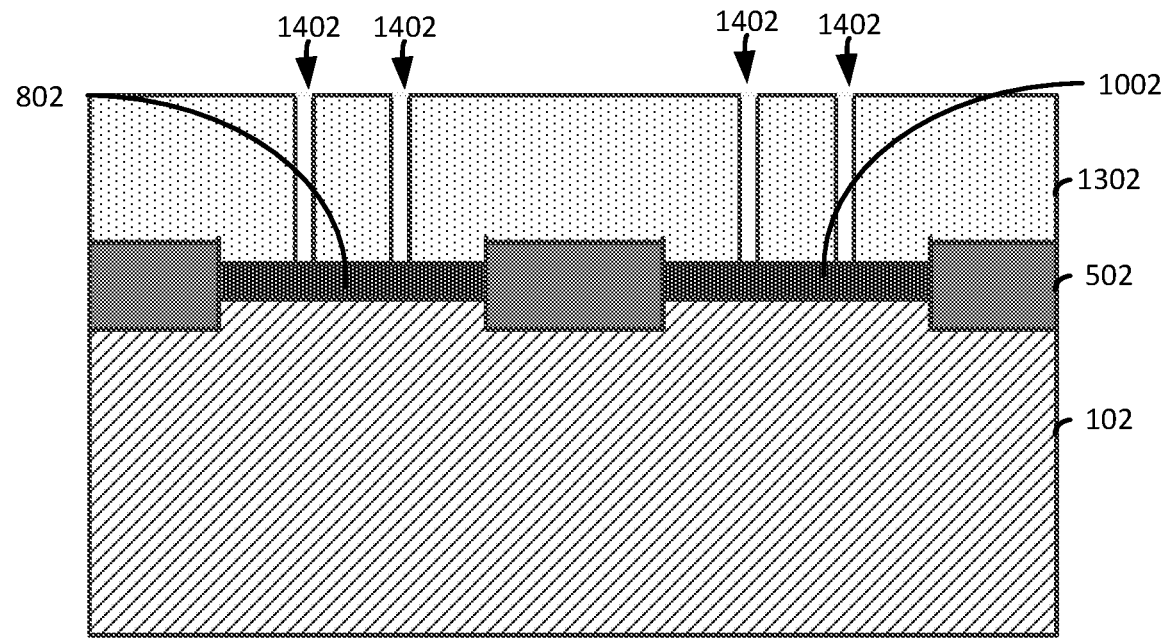
FIG. 14 illustrates a cut-away view following a lithographic patterning and etching process that removes portions of the layer of spacer material to form cavities that expose portions of the source/drain regions.

FIG. 14 illustrates a cut-away view following a lithographic patterning and etching process that removes portions of the layer of spacer material 1302 to form cavities 1402 that expose portions of the source/drain regions 802 and 1002. The etching process can include for example, reactive ion etching.

Figure 15A:
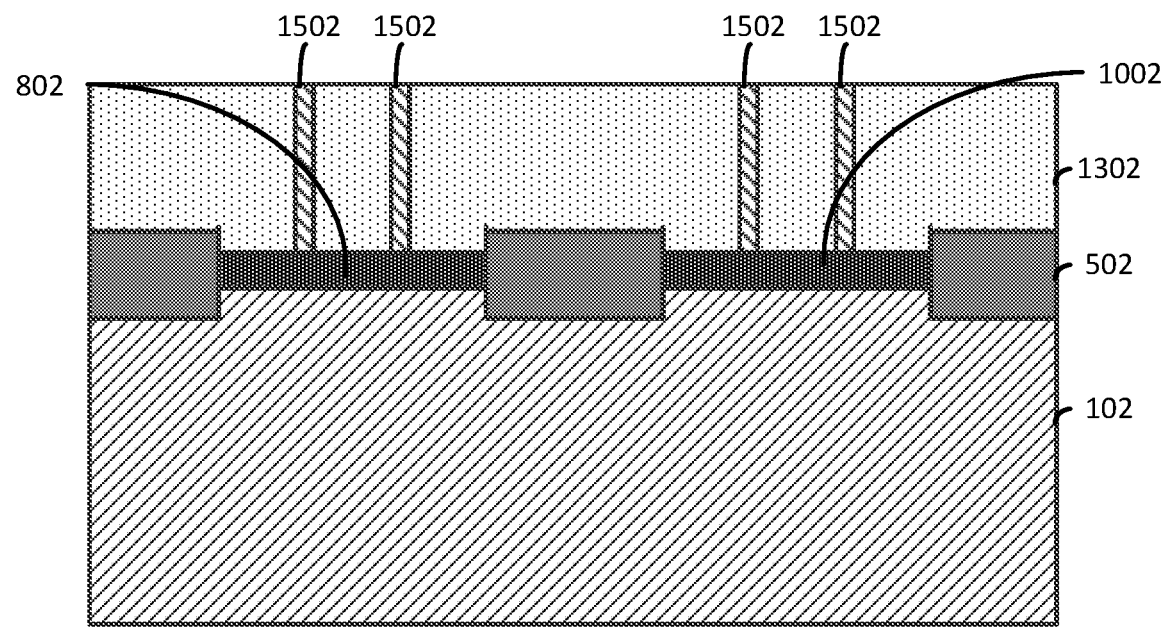
FIG. 15A illustrates a cut-away view along the line A-A (of FIG. 15B) following the growth of channel regions in the cavities (of FIG. 14).
Figure 15B:
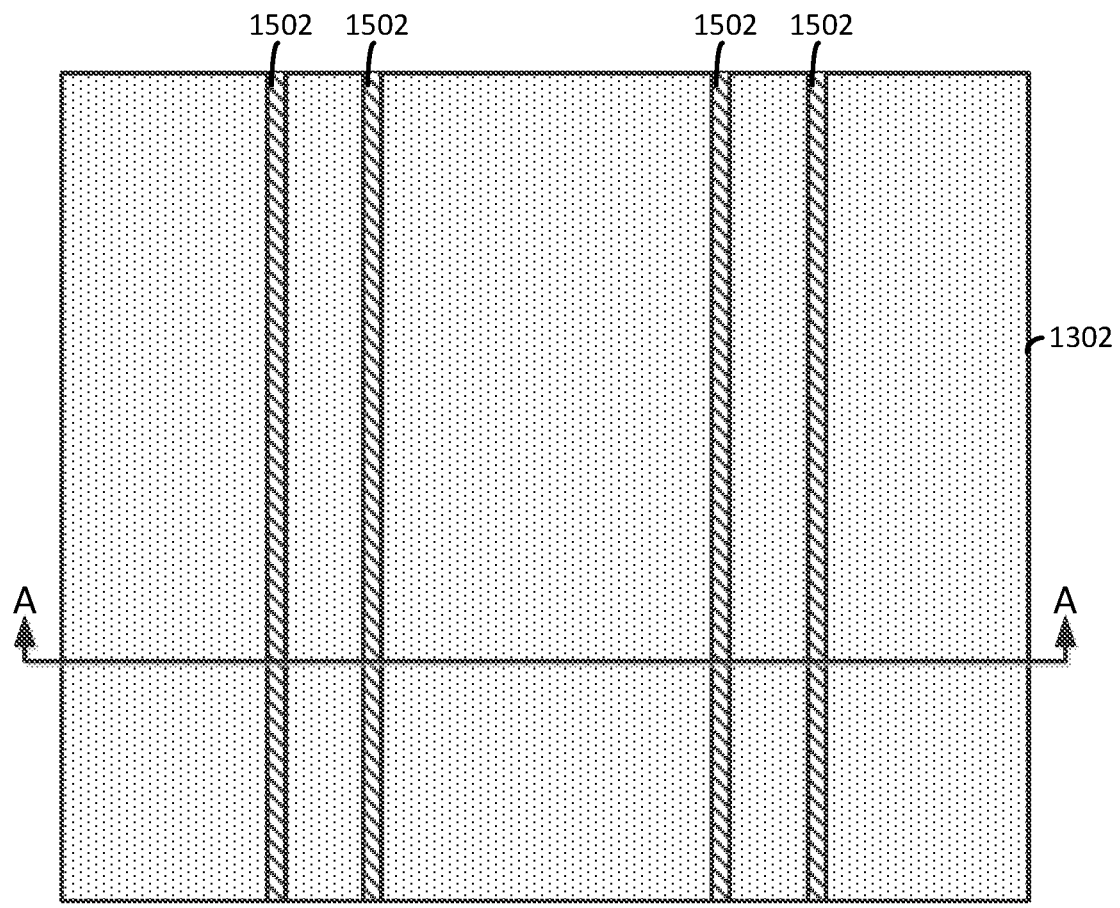
FIG. 15B illustrates a top view of the channel regions.

FIG. 15A illustrates a cut-away view along the line A-A (of FIG. 15B) following the growth of channel regions 1502 in the cavities 1402 (of FIG. 14). The channel regions 1502 are formed by an epitaxial growth process that forms the semiconductor channel regions 1502. FIG. 15B illustrates a top view of the channel regions 1502.

Figure 16:
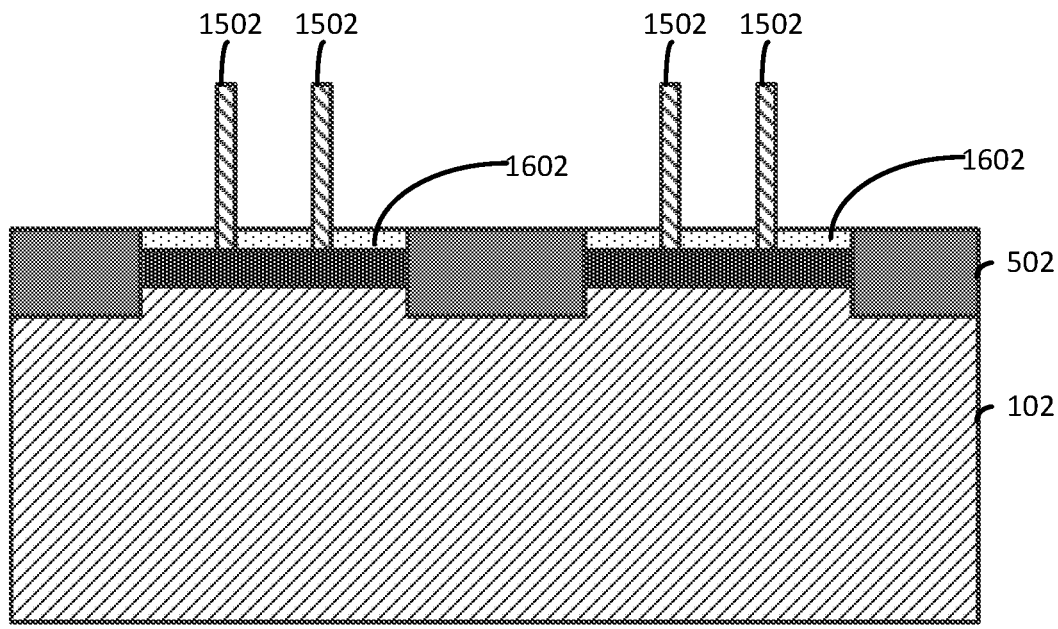
FIG. 16 illustrates a cut-away view following the removal of portions of the layer of spacer material (of FIG. 15A) to expose sidewalls of the channel regions.

FIG. 16 illustrates a cut-away view following the removal of portions of the layer of spacer material 1302 (of FIG. 15A) to expose sidewalls of the channel regions 1502. The removal of portions of the layer of spacer material 1302 by a selective anisotropic etching process such as, for example, reactive ion etching results in the formation of the spacers 1602 (e.g., bottom spacer).

Figure 17:
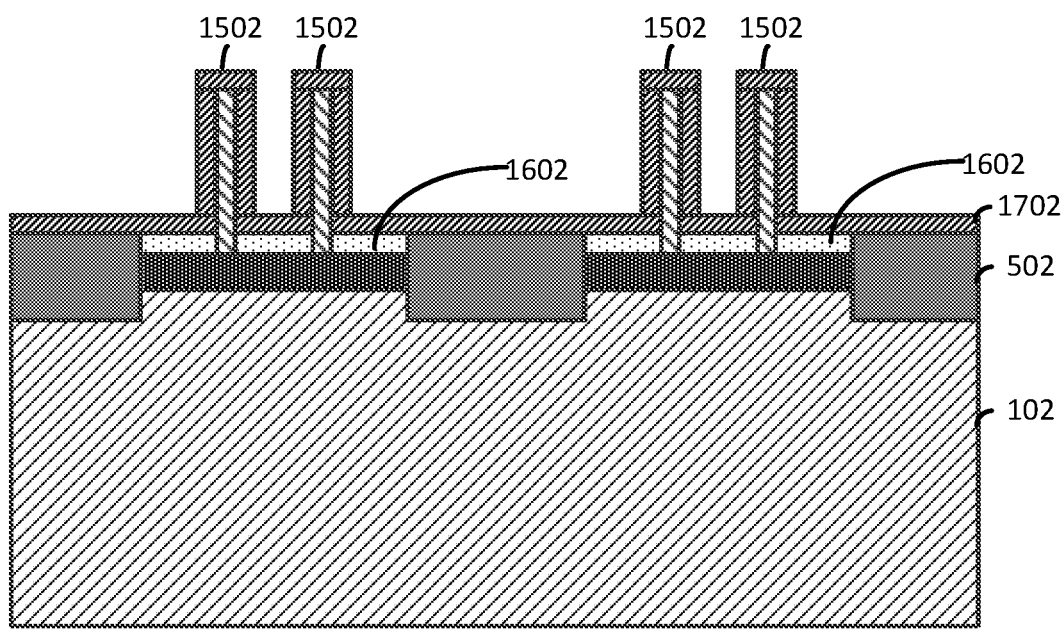
FIG. 17 illustrates a cut-away view following the deposition of a gate stack.

FIG. 17 illustrates a cut-away view following the deposition of a gate stack 1702. In this regard, the gate stack 1702 includes high-k metal gates formed, for example, by depositing one or more gate dielectric materials and one or more workfunction metals.

The gate dielectric material(s) can be a dielectric material having a dielectric constant greater than 3.9, 7.0, or 10.0. Non-limiting examples of suitable materials for the dielectric materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The gate dielectric materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The work function metal(s) can be disposed over the gate dielectric material. The type of work function metal(s) depends on the type of transistor and can differ between the nFET and pFET devices. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

Figure 18:
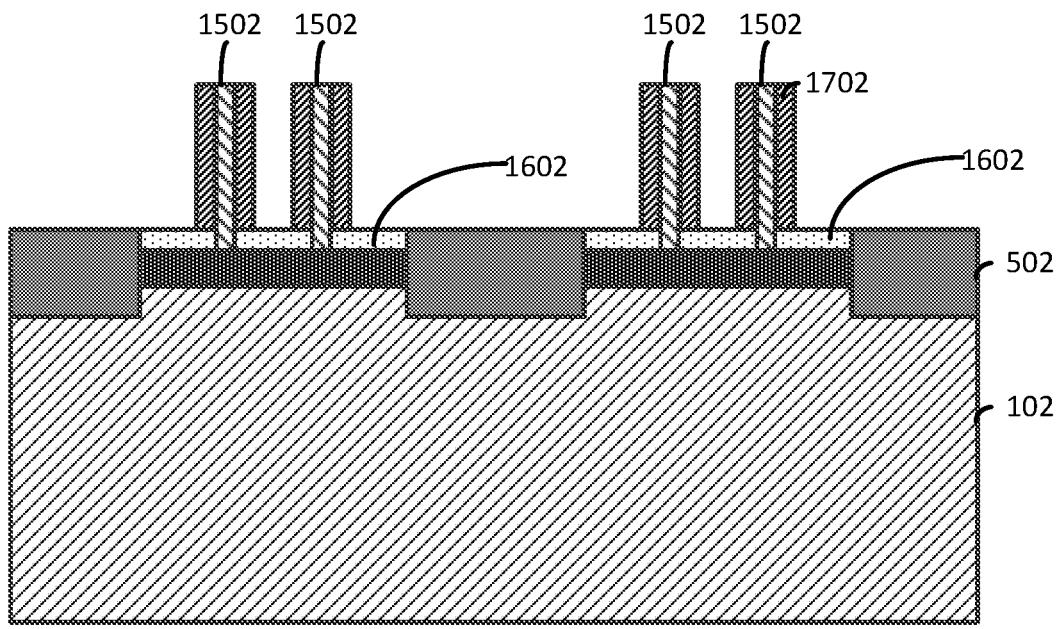
FIG. 18 illustrates a cut-away view following an etching process that removes portions of the layer of gate stack such that the only the sidewalls of the channel regions are covered with the gate stack.

FIG. 18 illustrates a cut-away view following an etching process that removes portions of the layer of gate stack 1702 such that the only the sidewalls of the channel regions 1502 are covered with the gate stack 1702. This can be performed by a suitable selective anisotropic etching process such as, for example, reactive ion etching.

Figure 19:
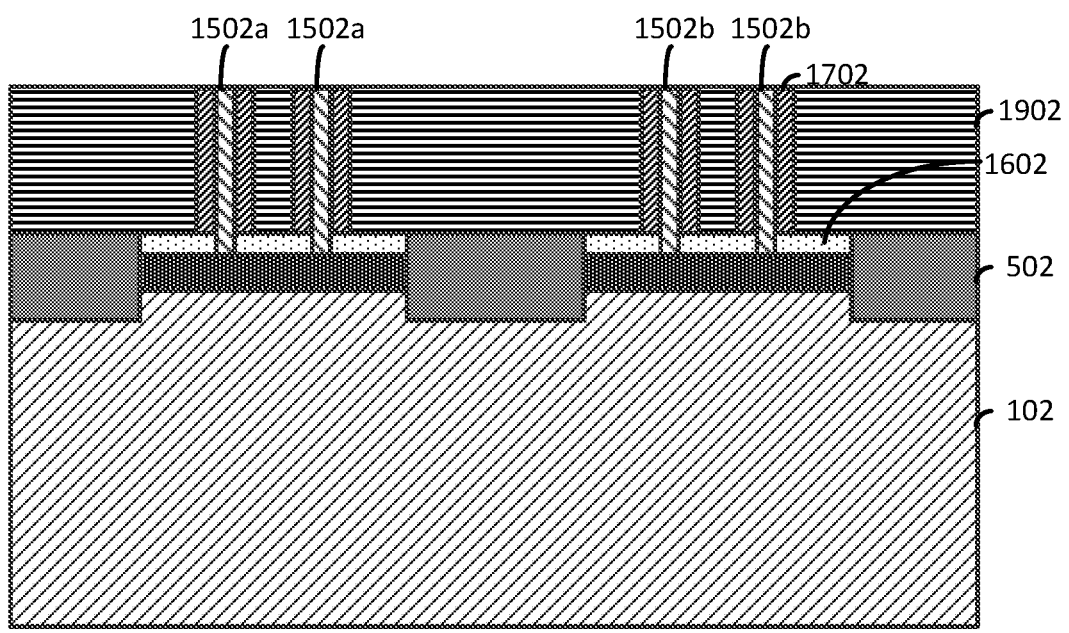
FIG. 19 illustrates a cut-away view following the deposition of a gate conductor.

FIG. 19 illustrates a cut-away view following the deposition of a gate conductor 1902. The gate conductor 1902 material(s) is deposited over the gate dielectric materials and work function metal(s) to form the gate stack. Non-limiting examples of suitable conductive metals include aluminum (Al), platinum (Pt), gold (Au), tungsten (W), titanium (Ti), or any combination thereof. The gate conductor 1902 material(s) can be deposited by a suitable deposition process, for example, CVD, PECVD, PVD, plating, thermal or e-beam evaporation, and sputtering.

Figure 20:
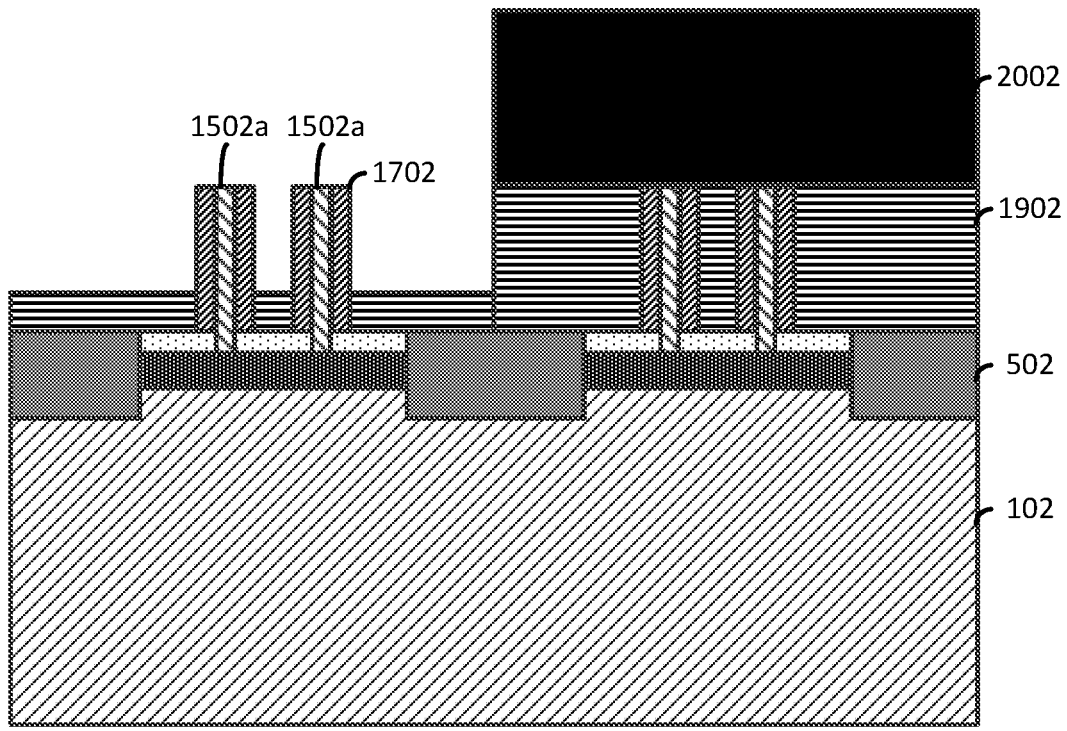
FIG. 20 illustrates a cut-away view following the patterning of a mask and a selective etching process that removes exposed portions of the gate conductor adjacent to the channel regions.

FIG. 20 illustrates a cut-away view following the patterning of a mask 2002 and a selective etching process that removes exposed portions of the gate conductor 1902 adjacent to the channel regions 1502*a*. Suitable resist masks include photoresists, electron-beam resists, ion-beam resists, X-ray resists, and etch resists. The resist can a polymeric spin on material or a polymeric material.

Figure 21:
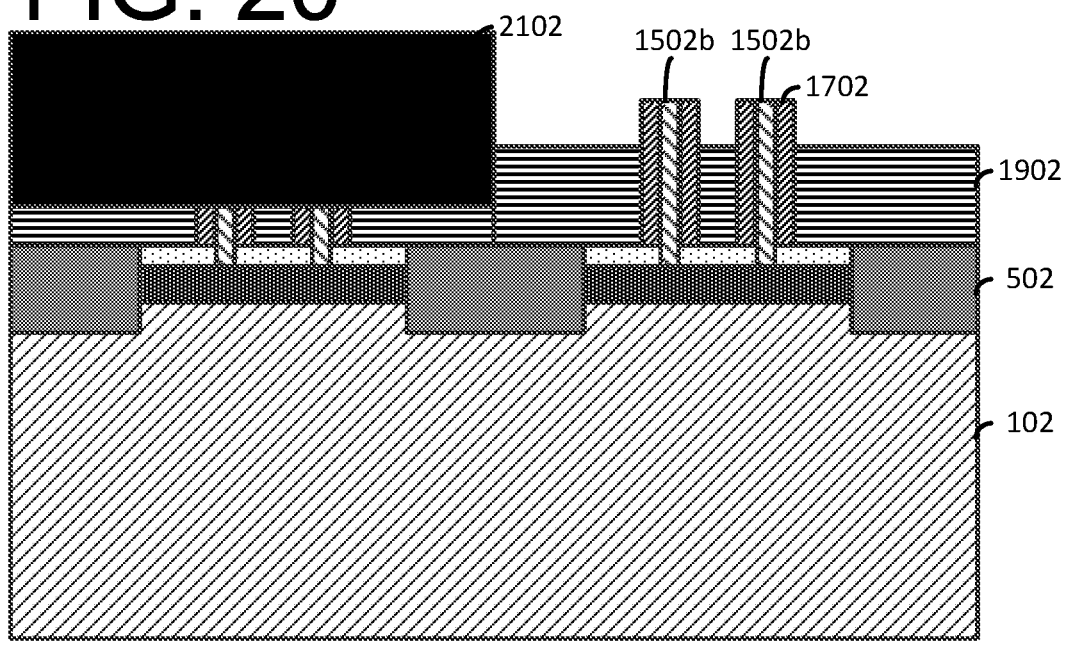
FIG. 21 illustrates a cut-away view following the removal of the mask (of FIG. 20) and the patterning of a mask over the channel regions.

FIG. 21 illustrates a cut-away view following the removal of the mask 2002 (of FIG. 20) and the patterning of a mask 2102 over the channel regions 1502*a*. The mask 2002 can be removed by, for example, ashing. The ashing process can be used to remove a photoresist material, amorphous carbon, or organic planarization (OPL) layer. Ashing is performed using a suitable reaction gas, for example, $O_2$, $N_2$, H2/N2, $O_3$, $CF_4$, or any combination thereof.

Following the patterning of the mask 2102, a selective etching process is performed that removes portions of the gate conductor 1902 adjacent to the channel regions 1502*b*.

Figure 22:
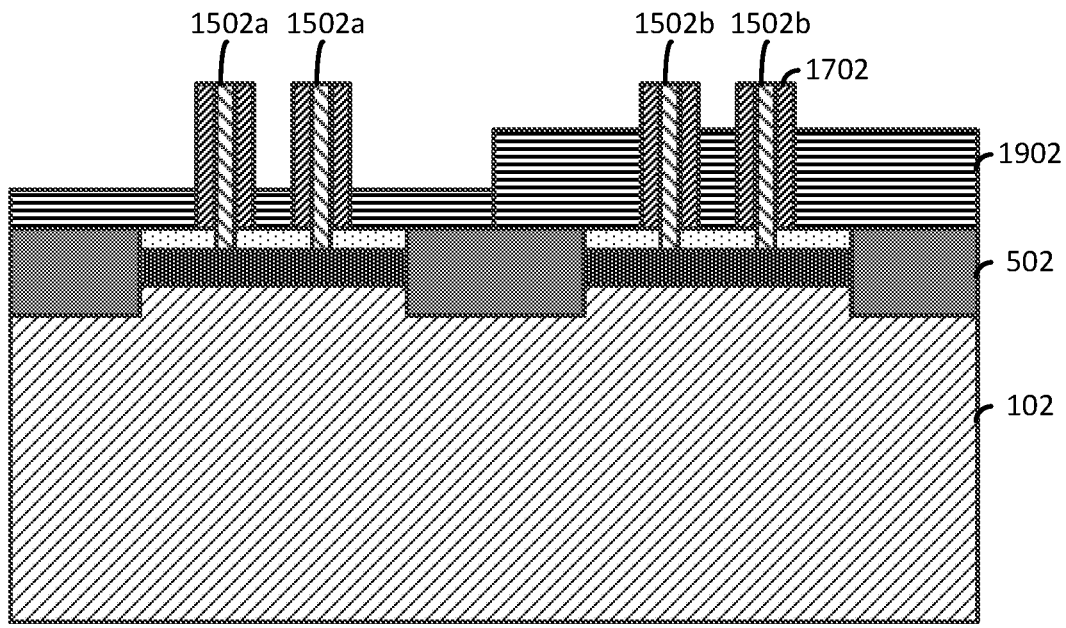
FIG. 22 illustrates a cut-away view following the removal of the mask (of FIG. 21).

FIG. 22 illustrates a cut-away view following the removal of the mask 2102 (of FIG. 21).

Figure 23:
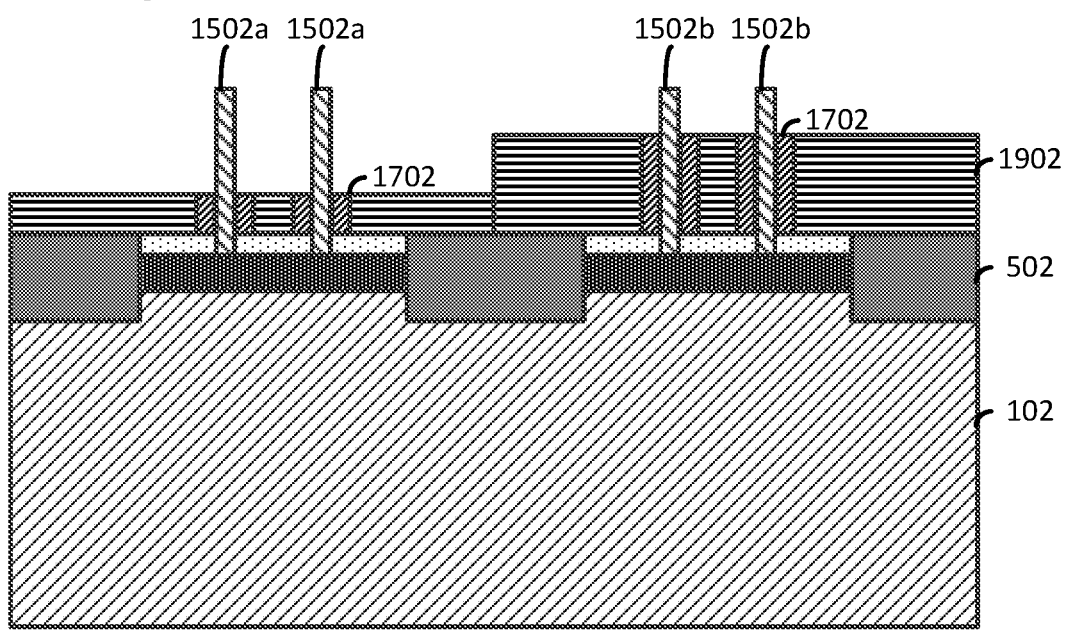
FIG. 23 illustrates a cut-away view following the removal of exposed portions of the gate stacks to expose portions of the channel regions.

FIG. 23 illustrates a cut-away view following the removal of exposed portions of the gate stacks 1702 to expose portions of the channel regions 1502*a* and 1502*b*. Portions of the gate stacks 1702 are removed using a suitable etching process.

Figure 24:
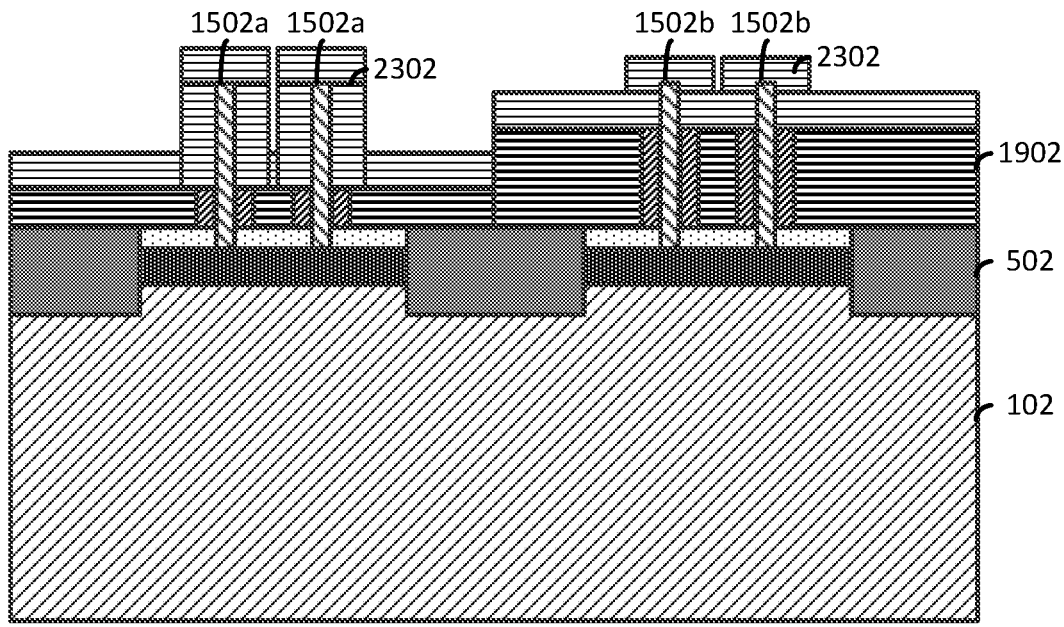
FIG. 24 illustrates a cut-away view following the deposition of a sacrificial spacer layer over exposed portions of the channel regions.

FIG. 24 illustrates a cut-away view following the deposition of a sacrificial spacer layer 2302 over exposed portions of the channel regions 1502*a* and 1502*b*. The sacrificial spacer layer 2302 can include, for example, a nitride or oxide material.

Figure 25:
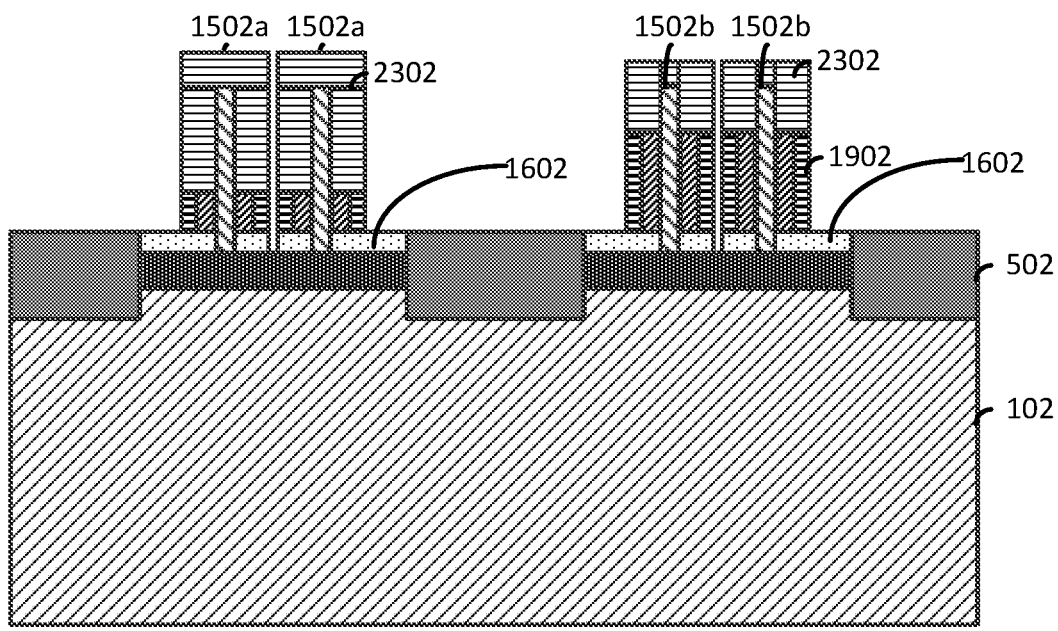
FIG. 25 illustrates a cut-away view following an anisotropic etching process that removes exposed portions of the sacrificial spacer layer and the gate conductor to expose portions of the spacers.

FIG. 25 illustrates a cut-away view following an anisotropic etching process that removes exposed portions of the sacrificial spacer layer 2302 and the gate conductor 1902 to expose portions of the spacers 1602. A suitable etching process such as, for example, reactive ion etching can be used.

Figure 26:
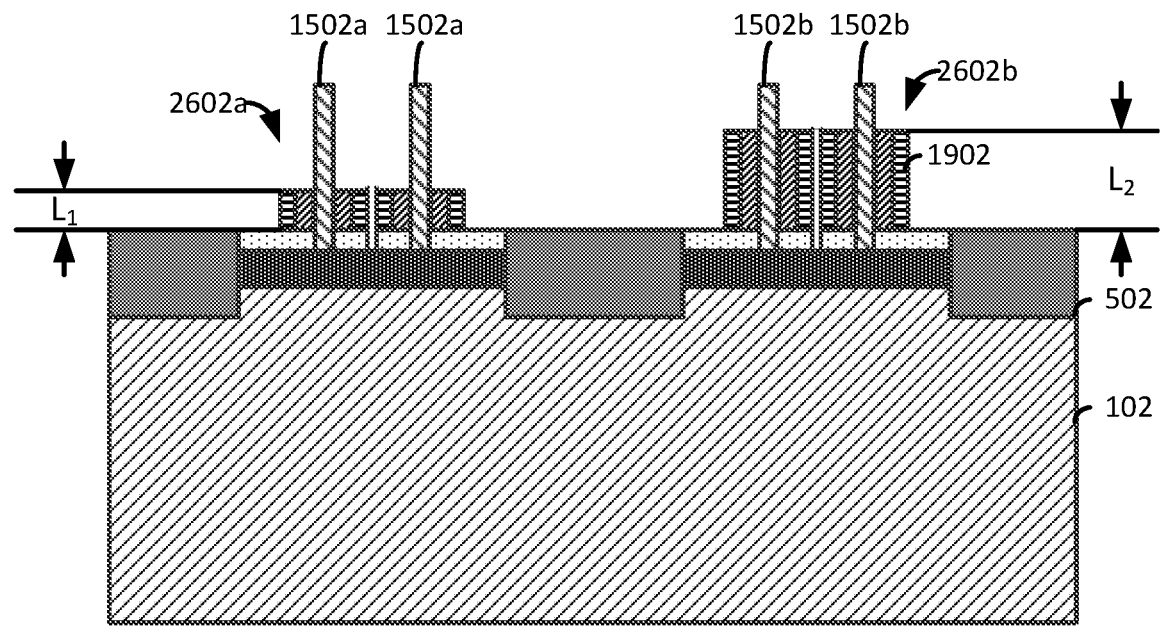
FIG. 26 illustrates a cut-away view following the removal of the sacrificial spacer layer.

FIG. 26 illustrates a cut-away view following the removal of the sacrificial spacer layer 2302. The resultant gate stacks 2602*a* and 2602*b* have dissimilar channel lengths. In this regard the gate stack 2602*a* has a channel length ($L_1$) while the gate stack 2602*b* has a channel length ($L_2$) where $L_1 < L_2$.

Figure 27A:
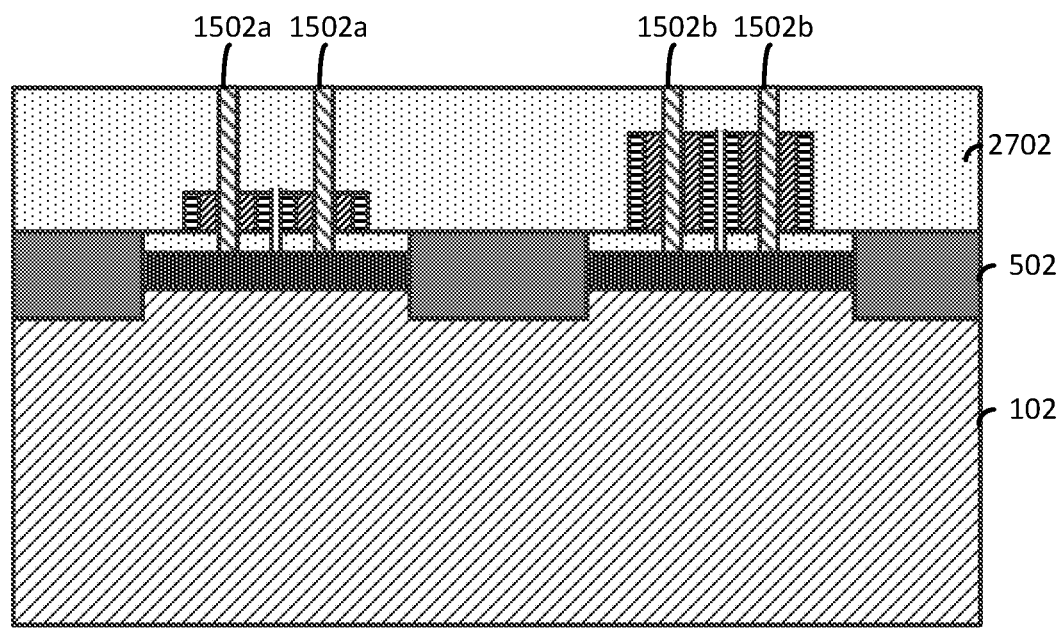
FIG. 27A illustrates a cut-away view along the line A-A (of FIG. 27B) following the deposition of another layer of spacer material.
Figure 27B:
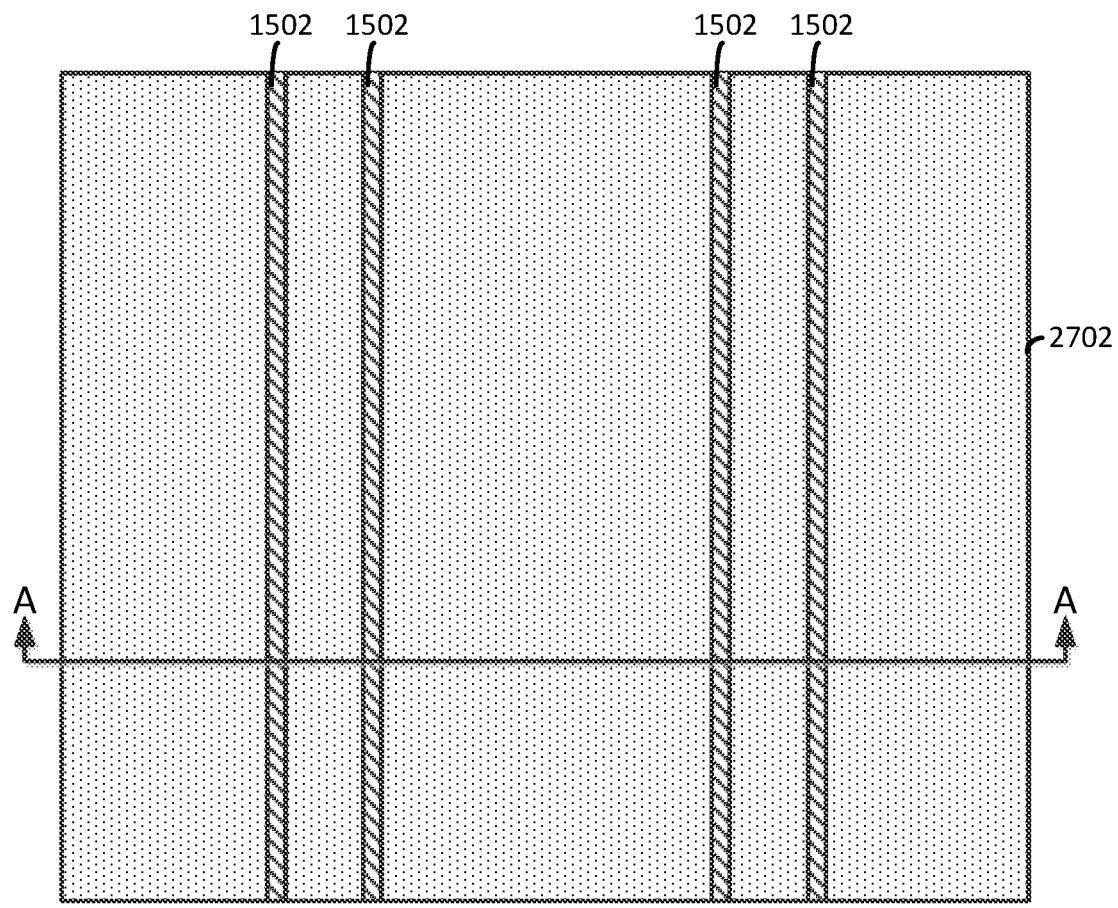
FIG. 27B illustrates a top view of the channel regions.

FIG. 27A illustrates a cut-away view along the line A-A (of FIG. 27B) following the deposition of another layer of spacer material 2702 (e.g., top spacer). The layer of spacer material 2702 can be formed by, depositing the spacer material followed by an etching or planarization process that exposes portions of the channel regions 1502*a* and 1502*b*. FIG. 27B illustrates a top view of the channel regions 1502*a* and 1502*b*.

Figure 28:
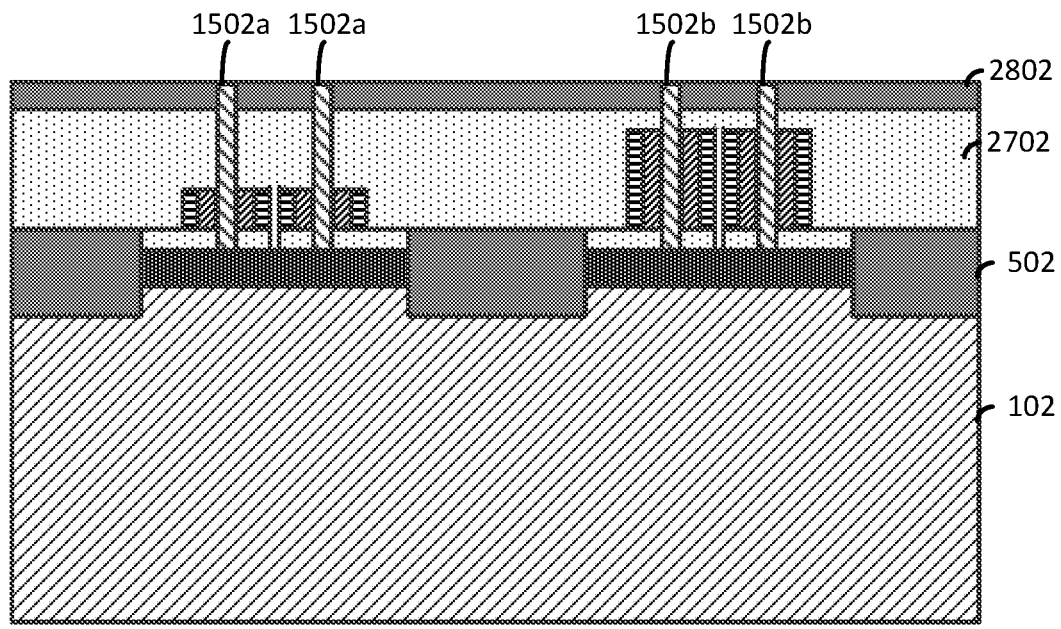
FIG. 28 illustrates a cut-away view following the removal of portions of the layer of spacer material to further expose portions of the channel regions.

FIG. 28 illustrates a cut-away view following the removal of portions of the layer of spacer material 2702 to further expose portions of the channel regions 1502*a* and 1502*b* and the deposition of an inter-level dielectric layer 2802.

The inter-level dielectric layer 2802 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 2802 is deposited by a deposition process, including, but not limited to CVD, PVD, plasma enhanced CVD, atomic layer deposition (ALD), evaporation, chemical solution deposition, or like processes. Following the deposition of the inter-level dielectric layer 2802, a planarization process such as, for example, chemical mechanical polishing is performed.

Figure 29:
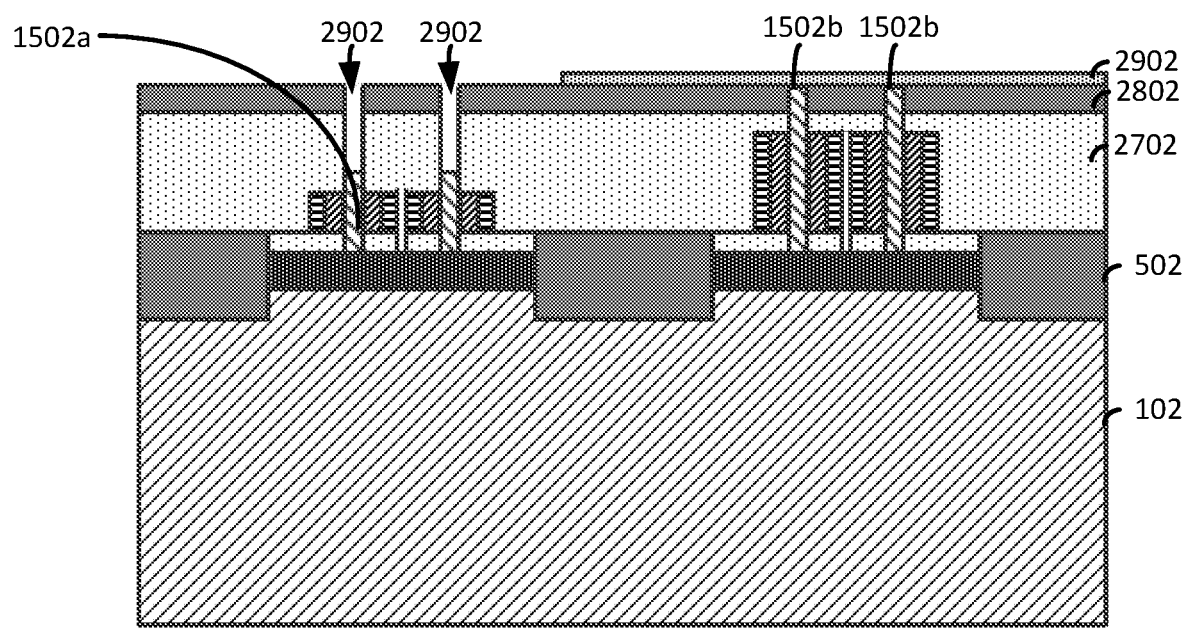
FIG. 29 illustrates a cut-away view following the deposition and patterning of a hardmask over a portion of the inter-level dielectric layer and the removal of portions of the channel region to form a cavity.

FIG. 29 illustrates a cut-away view following the deposition and patterning of a hardmask 2902 over a portion of the inter-level dielectric layer 2802 and the removal of portions of the channel region 1502 to form a cavity 2902.

Figure 30:
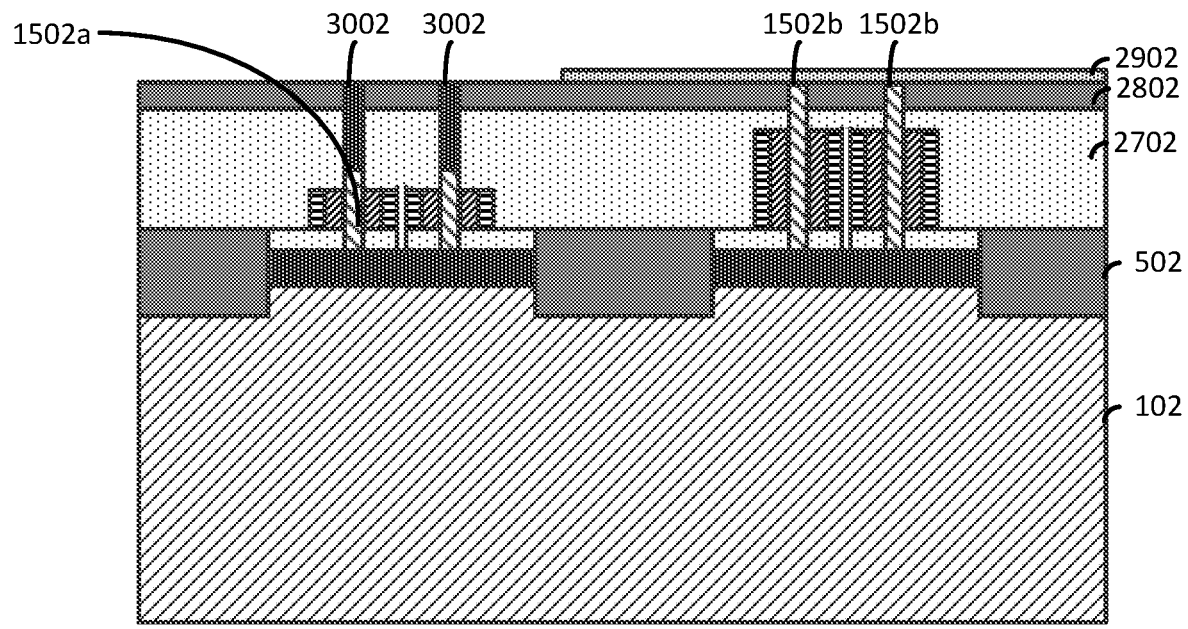
FIG. 30 illustrates a cut-away view following the formation of source/drain region that is epitaxially grown from exposed portions of the channel regions in the cavity to fill the cavity.

FIG. 30 illustrates a cut-away view following the formation of source/drain region 3002 that is epitaxially grown from exposed portions of the channel regions 1502*a* in the cavity 2902 to fill the cavity 2902.

Figure 31:
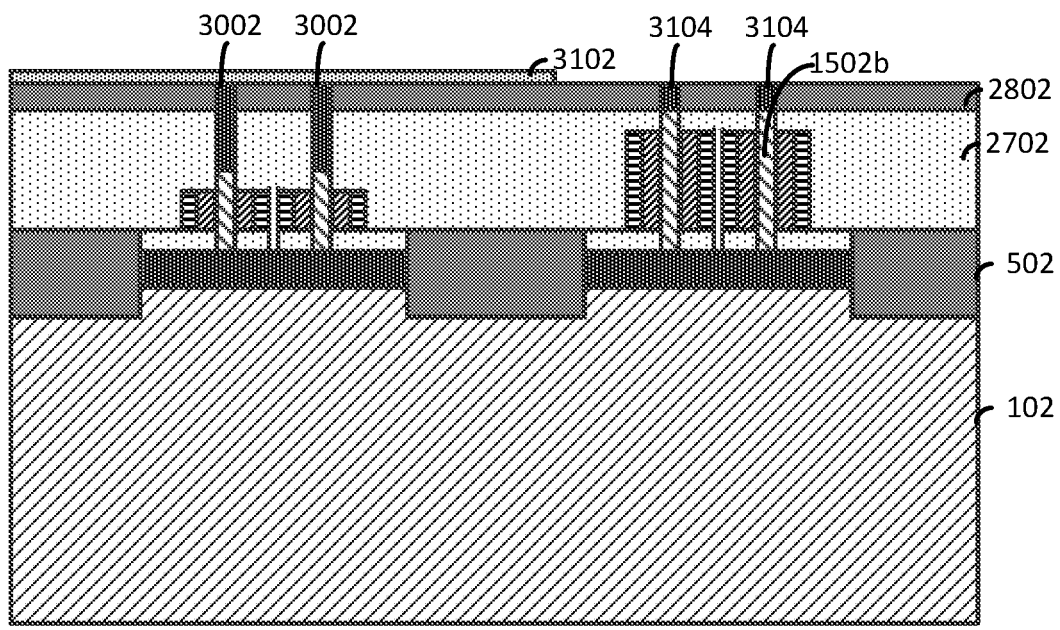
FIG. 31 illustrates a cut-away view following the removal of the hardmask (of FIG. 30) and the patterning of a hardmask.

FIG. 31 illustrates a cut-away view following the removal of the hardmask 2902 (of FIG. 30) and the patterning of a hardmask 3102. Following the patterning of the hardmask 3102 portions of the channel regions 1502*b* are removed and source/drain regions 3104 are grown in the resultant cavities.

Figure 32:
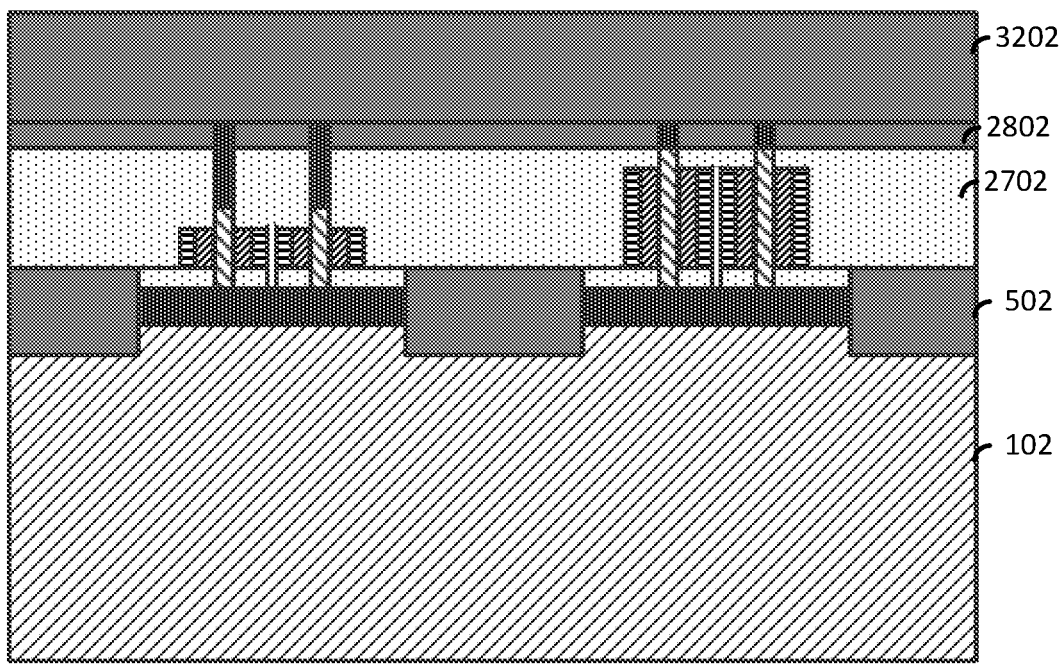
FIG. 32 illustrates a cut-away view following the deposition of an inter-level dielectric layer over the source/drain regions and portions of the inter-level dielectric layer.

FIG. 32 illustrates a cut-away view following the deposition of an inter-level dielectric layer 3202 over the source/drain regions and portions of the inter-level dielectric layer 2802.

Figure 33:
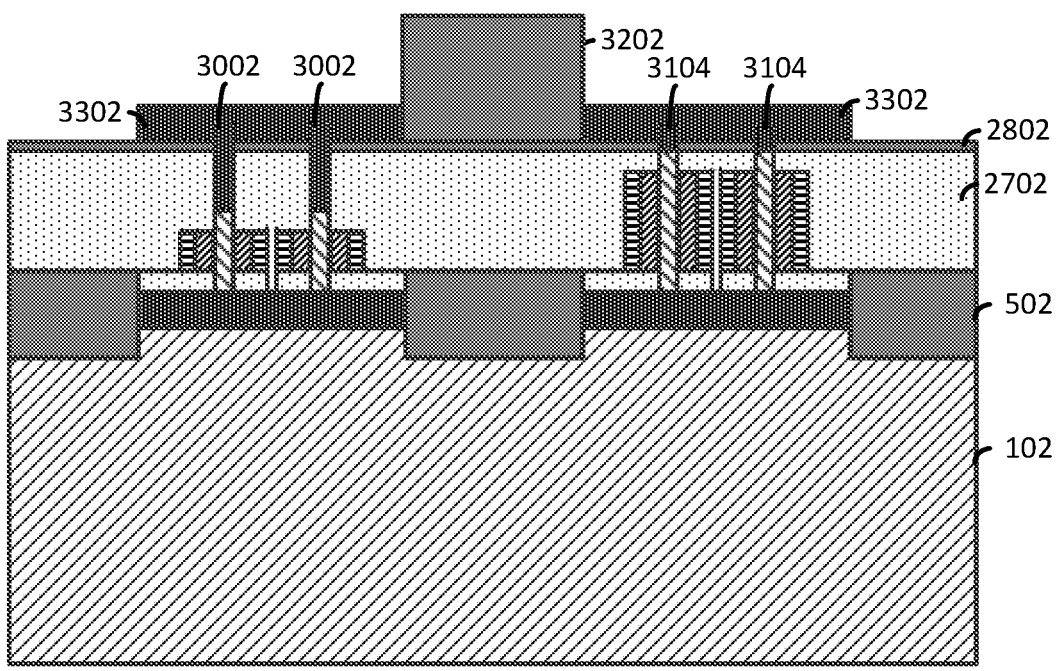
FIG. 33 illustrates a cut-away view following the formation of source/drain regions that are epitaxially grown from exposed portions of the source/drain regions.

FIG. 33 illustrates a cut-away view following the formation of source/drain regions 3302 that are epitaxially grown from exposed portions of the source/drain regions 3002 and 3104.

Figure 34:
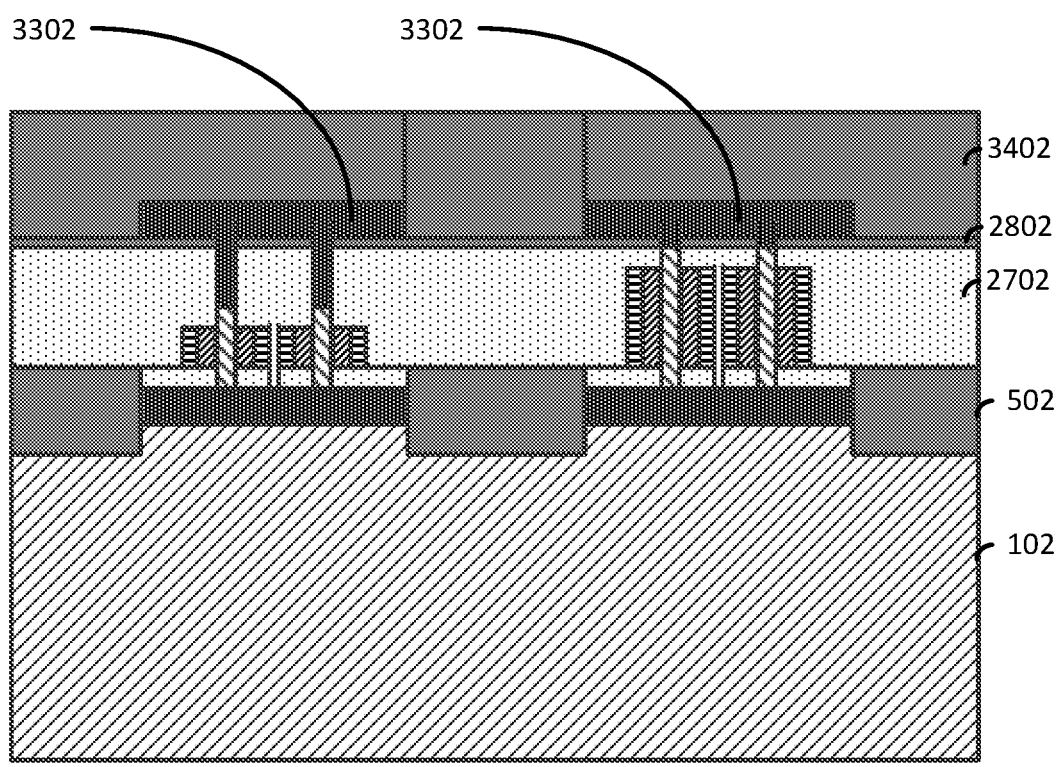
FIG. 34 illustrates a cut-away view following the deposition of additional inter-level dielectric layer material.

FIG. 34 illustrates a cut-away view following the deposition of additional inter-level dielectric layer material 3402 using a similar method as described above to insulate the source/drain regions 3302.

After the devices are formed, additional insulating material (not shown) can be deposited over the device(s). The insulating material can be patterned to form cavities (not shown) that expose portions of the source/drain regions and the gate stack contacts. The cavities can be filled by a conductive material (not shown) and, in some embodiments, a liner layer (not shown) to form conductive contacts (not shown).

The methods and resultant structures described herein provide for vertical FET devices formed on a substrate having dissimilar channel lengths.

As used herein, the terms "invention" or "present invention" are non-limiting terms and not intended to refer to any single aspect of the particular invention but encompass all possible aspects as described in the specification and the claims. The term "on" can refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
   a first channel region on a first source/drain region, the first source/drain region being arranged on a semiconductor substrate;
   a second channel region on a second source/drain region, the second source/drain region being arranged on the semiconductor substrate;
   a bottom spacer arranged on the first source/drain region and on the second source/drain region;
   a first gate stack having a first length arranged on the first source/drain region;
   a second gate stack having a second length arranged on the second source/drain region, the first length is shorter than the second length; and
   a top spacer arranged on the first gate stack and the second gate stack.

2. The semiconductor device of claim 1, further comprising another first source/drain region on the first channel region opposite the first source/drain region.

3. The semiconductor device of claim 1, further comprising another second source/drain region on the second channel region opposite the second source/drain region.

4. The semiconductor device of claim 1, wherein the bottom spacer is on the first channel region.

5. The semiconductor device of claim 1, wherein the bottom spacer is on the second channel region.

6. The semiconductor device of claim 1, wherein the first gate stack having the first length is on the first channel region.

7. The semiconductor device of claim 1, wherein the second gate stack having the second length is on the second channel region.

8. The semiconductor device of claim 1, wherein a gate conductor is on the first gate stack.

9. The semiconductor device of claim 1, wherein a gate conductor is on the second gate stack.

10. The semiconductor device of claim 1, wherein the first gate stack is separate from the second gate stack.

11. The semiconductor device of claim 1, wherein the device includes a vertical field effect transistor.

12. The semiconductor device of claim 1, wherein the first channel region is separate from the second channel region.

13. The semiconductor device of claim 1, wherein a portion of the top spacer separates the first channel region from the second channel region.

14. The semiconductor device of claim 1, wherein a portion of the top spacer separates the first gate stack and the second gate stack.

15. The semiconductor device of claim 1, wherein the first source/drain region comprises epitaxial material.

16. The semiconductor device of claim 1, wherein the first source/drain region comprises one or more dopants.

17. The semiconductor device of claim 1, wherein the second source/drain region comprises epitaxial material.

18. The semiconductor device of claim 1, wherein the second source/drain region comprises one or more dopants.

19. The semiconductor device of claim 1, wherein a shallow trench isolation region separates the first source/drain region and the second source/drain region.

20. The semiconductor device of claim 1, wherein the first gate stack and the second gate stack comprises a dielectric material.

* * * * *